United States Patent [19] [11] 4,209,853
Hyatt [45] Jun. 24, 1980

[54] HOLOGRAPHIC SYSTEM FOR OBJECT LOCATION AND IDENTIFICATION

[76] Inventor: Gilbert P. Hyatt, P.O. Box 4584, Anaheim, Calif. 92803

[21] Appl. No.: 490,816

[22] Filed: Jul. 22, 1974

[51] Int. Cl.² ............................. G01S 9/66; G03H 3/00
[52] U.S. Cl. ................................... 367/8; 367/9; 367/103; 367/123; 367/11; 343/17
[58] Field of Search ........................... 343/5 DP, 17; 307/221 D; 340/5 MP, 5 H, 6 R, 7 R, 15.5 DP

[56] References Cited

U.S. PATENT DOCUMENTS

| | | | |
|---|---|---|---|
| 3,356,989 | 12/1967 | Autrey | 340/6 R |
| 3,613,071 | 10/1971 | Quay | 340/15.5 MC |
| 3,775,738 | 11/1973 | Quay et al. | 340/7 R |
| 3,787,852 | 1/1974 | Puckette et al. | 343/7.7 |
| 3,826,926 | 7/1974 | White et al. | 307/221 D |
| 3,852,745 | 12/1974 | Lebail | 340/5 MP |
| 3,873,958 | 3/1975 | Whitehouse | 340/6 R |
| 3,895,342 | 7/1975 | Mallett et al. | 340/15.5 DP |
| 3,942,034 | 3/1976 | Buss | 307/221 D |

OTHER PUBLICATIONS

Altman, *Electronics*, Feb. 28, 1972, pp. 62–71.
Baertsch et al., *Electronics*, Dec. 6, 1971, pp. 86–91.

*Primary Examiner*—Richard A. Farley
*Attorney, Agent, or Firm*—Gilbert P. Hyatt

[57] ABSTRACT

An arrangement is provided for locating and identifying objects using holographic techniques. Improvements are achieved by array configuration and particularly with the use of a plurality of arrays to provide different types of information related to the same object. In one embodiment, a high resolution narrow field-of-view array is provided in combination with a low resolution wide field-of-view array. The low resolution array resolves the ambiguity for object location and the high resolution array permits object identification; wherein the combination of a high resolution narrow field-of-view array and a low resolution wide field-of-view array provides significant advantages over the conventional high resolution wide field-of-view array.

A general purpose high resolution wide field-of-view array may be provided for obtaining desired information. In a mode requiring high computational rates, portions of the general purpose array may be selected to provide specific information. For example, a high resolution narrow field-of-view sub-array and a low resolution wide field-of-view sub-array may each be part of the general purpose array, selected as a limited set of array points. Processing information from the sub-arrays minimizes the amount of information that must be processed and therefore significantly increases array processing speed.

A frequency control arrangement is also provided for controlling resolution and field-of-view with the transmitted signal frequency.

A signal processing and memory arrangement using charge coupled devices is further provided which are generally useable for signal processing and memory operations and may be used in a preferred embodiment of the present invention.

1 Claim, 14 Drawing Figures

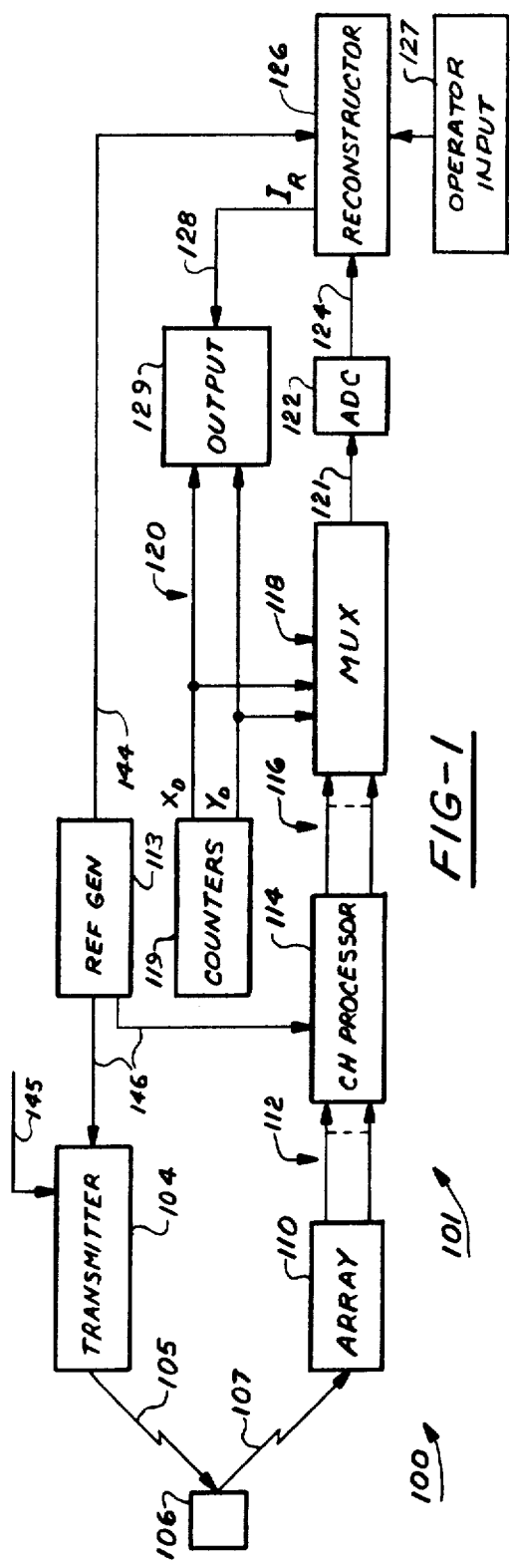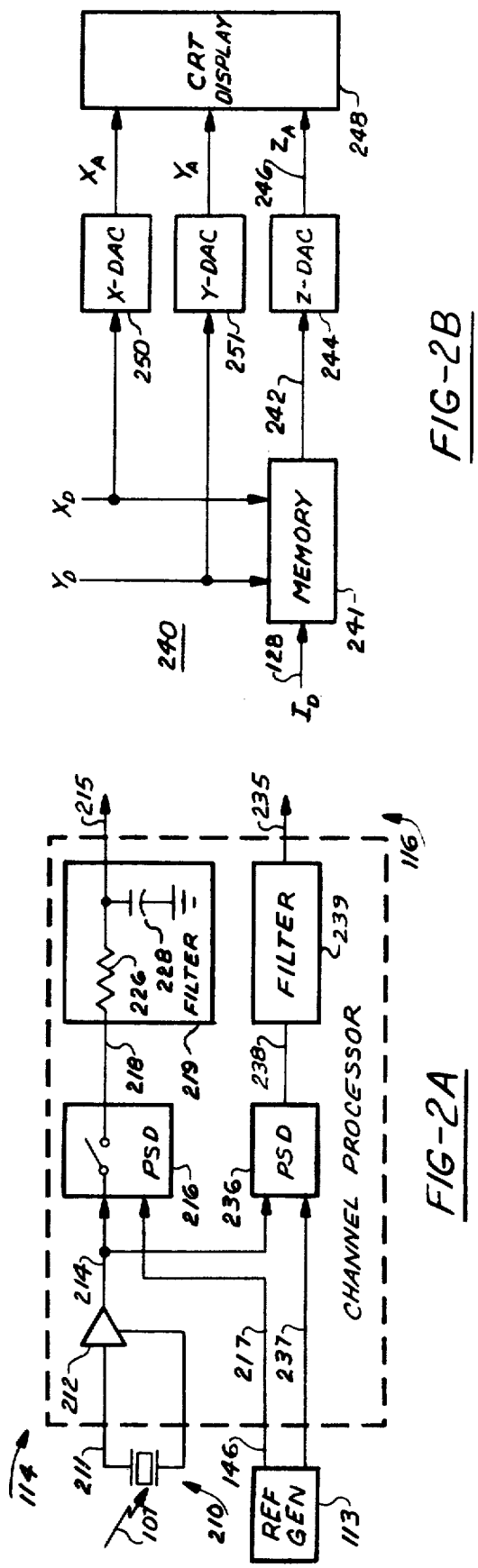

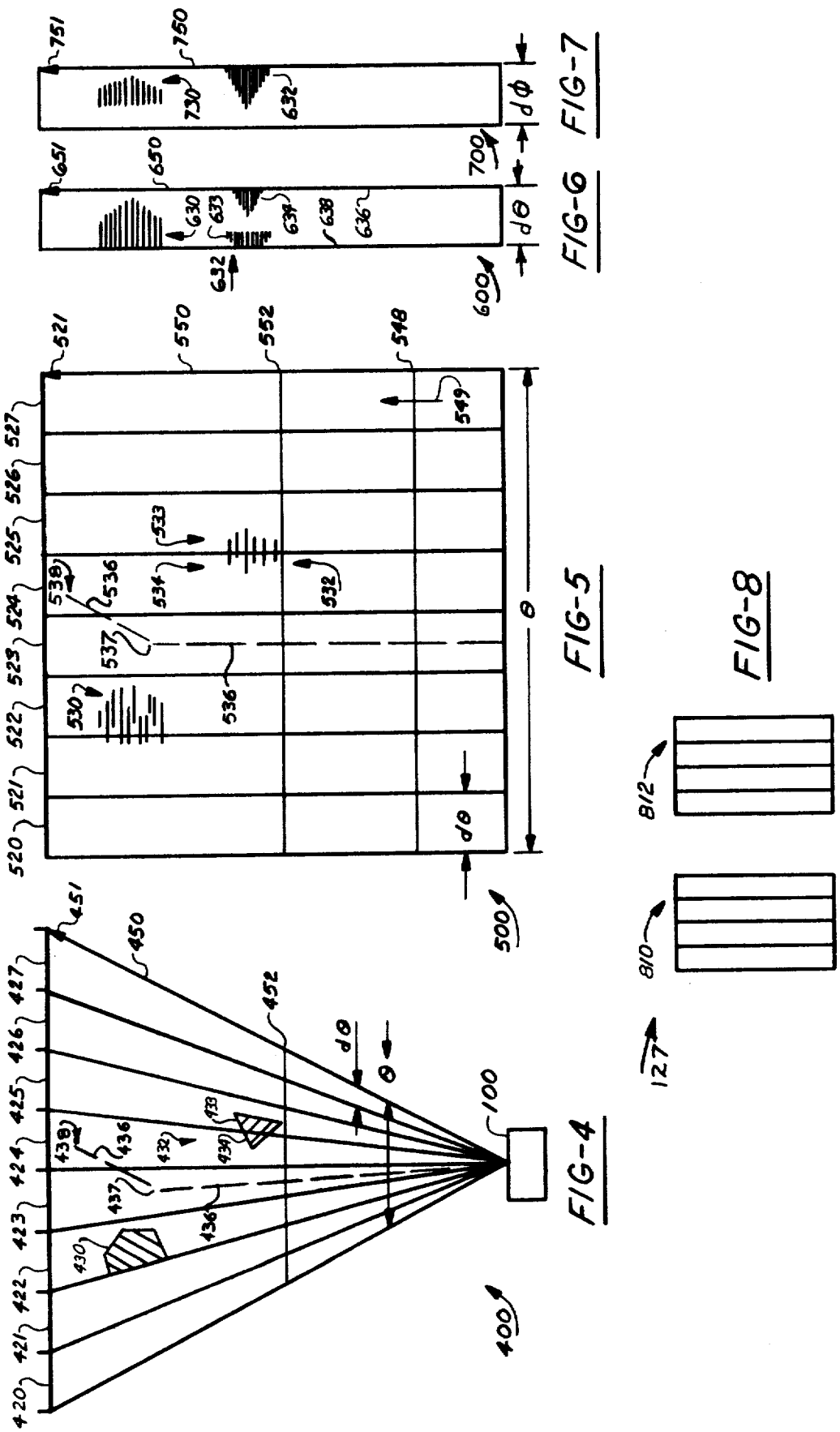

HOLOGRAPHIC SYSTEM FOR OBJECT LOCATION AND IDENTIFICATION

CROSS REFERENCE TO RELATED APPLICATIONS

The instant application is related to the following applications.

(a) Factored Data Processing System For Dedicated Applications Serial No. 101,881 filed on Dec. 28, 1970 by Gilbert P. Hyatt.

(b) Control System and Method Serial No. 134,958 filed on April 19, 1971 by Gilbert P. Hyatt.

(c) Control Apparatus Serial No. 135,040 filed on April 19, 1971 by Gilbert P. Hyatt.

(d) Means And Method For Selectively Controlling Animals Serial No. 438,328 filed on Jan. 31, 1974 now U.S. Pat. No. 3,897,753 issued on Aug. 5, 1975 by Batty T. Lee and Gilbert P. Hyatt (e) Adaptive Memory Compensation Arrangement Serial No. 522,559 filed on Nov. 11, 1974 by Gilbert P. Hyatt and issuing contemporaneously with the instant application.

(f) Method And Apparatus for Signal Enhancement With Improved Digital Filtering Serial No. 550,231 filed on Feb. 14, 1975 by Gilbert P. Hyatt and issuing contemporaneously with the instant application.

BACKGROUND OF THE INVENTION

1. Field of the Invention

This invention relates to array systems and, in particular, to location and identification of objects using holographic techniques.

2. Description of the Prior Art

Holographic systems are well known in the art and include light holography, radar holography, and acoustic holography. Light holography generally utilizes a laser or other coherent source of light. Radar holography uses electromagnetic waves such as with a radar system. Acoustic holography uses sound waves such as for underwater imaging, geophysical exploration, biological acoustics, and others.

Holographic techniques are usually based upon illuminating an object with coherent signals; although coherency is not necessarily a requirement; then monitoring the reflected signals with an array of sensors. The sensor signals are transformed from Barry interference pattern to an image using a Fast Fourier Transform or other well known techniques.

Further, charge coupled devices (CCDs) have not been used in signal processing and memory arrangements as provided for herein.

BRIEF DESCRIPTION OF THE INVENTION

The present invention provides an improved imaging capability to enhance location and identification of objects and to provide an arrangement that permits greater processing rates and reduced hardware over prior art imaging systems.

Holography has significant advantages over prior art arrangements. For example, holography provides more precise information on the shape and configuration of an object to provide more precise location and identification. In one prior art application, a sonar system is used to acoustically locate a target, where only the general size and shape of the target may be determined. The use of acoustic imaging in a sonar system may provide a precise pictorial representation of an underwater object in three dimensions. Therefore, it can be seen that the location and identification of objects with holographic techniques provides improvements and well known distinctions over other prior art arrangements that do not provide an imaging capability.

An arrangement is provided to optimize array configuration, wherein one array or a plurality of arrays may be provided having simple hardware configuration and reduced processing requirements but providing at least a portion of the information available with prior art systems or providing substantially all of the information available with prior art arrangements. In prior art arrangements, the number of elements in an array is usually determined by the field-of-view and the resolution required for the image. In accordance with one feature of the present invention, a plurality of sub-arrays may be provided wherein a first sub-array may have a wide field-of-view and a low resolution and a second sub-array may have a narrow field-of-view and a high resolution. The combination of the plurality of sub-arrays may provide substantially all of the required information for locating and identifying an object and may provide a significant improvement in processing speed and a significant reduction in system complexity over prior art arrangements.

In accordance with another feature of the present invention, a plurality of displays may be provided, wherein a first display may have a wide field-of-view and a low resolution and a second display may have a narrow field-of-view and a high resolution for precisely locating and identifying objects. Further, these displays may be substantially three dimensional displays which are presented on a two dimensional display device wherein one of the three dimensions may be compressed into a line, thereby providing two dimensions of non-ambiguous display and a third dimension of ambiguous display but without loss of display information.

A still further feature of the present invention provides rapid searching of an environment to permit an operator to view the total environment; where the environment is interrogated without concern for loss of information such as caused by an image of a detected object flashing on the display more rapidly than an operator's eye can respond to the rapidly changing display image.

In accordance with yet another feature of the present invention, the reference frequency associated with the transmitted signal and other system operations may be variable to control the field-of-view and resolution of the system. The frequency may be controllable manually by an operator, automatically such as with a computer, or with other well known control techniques.

In accordance with still another feature of the present invention, an arrangement is provided for controlling the system parameters such as resolution and field-of-view. The control technique may be provided by selection of a subset of array elements, or by controlling the illuminating signal frequency, or with other disclosed implementations.

In accordance with yet another feature of the present invention, signal processing and memory arrangements using charge coupled devices are provided for improved capability and economy.

The forgoing and other objects, features, and advantages of this invention will become apparent from the following detailed description of preferred embodiments of this invention, as illustrated in the accompanying drawings.

BRIEF DESCRIPTION OF THE DRAWINGS

A better understanding of the invention may be had from a consideration of the detailed description hereinafter taken in conjunction with the drawings which are described below.

FIG. 1 is a block diagram of an acoustic imaging system in accordance with the present invention.

FIG. 2 comprising FIGS. 2A and 2B provides detailed representation of blocks shown in FIG. 1; wherein FIG. 2A shows a detailed embodiment of a channel processor and FIG. 2B shows a detailed embodiment of a CRT display output.

FIG. 4 illustrates the geometry of an environment interrogated by the system of the present invention.

FIG. 5 illustrates a low resolution and wide field-of-view display arrangement.

FIG. 6 illustrates a high resolution and narrow field-of-view display arrangement FIG. 7 illustrates an intermediate resolution and intermediate field-of-view display arrangement.

FIG. 8 illustrates operator control arrangements in accordance with the present invention.

FIG. 9 comprises FIGS. 9A-9E illustrates signal processing arrangements using charge couple devices (CCDs) in accordance with the present invention; wherein FIG. 9A illustrates a CCD channel processor arrangement, FIG. 9B illustrates a CCD beam forming arrangement, FIG. 9C illustrates a CCD hybrid memory arrangement, FIG. 9D illustrates signal degradation and compensation in accordance with the hybrid memory arrangement of the present invention, and FIG. 9E illustrates an alternate embodiment of a CCD memory arrangement.

Figure 3:
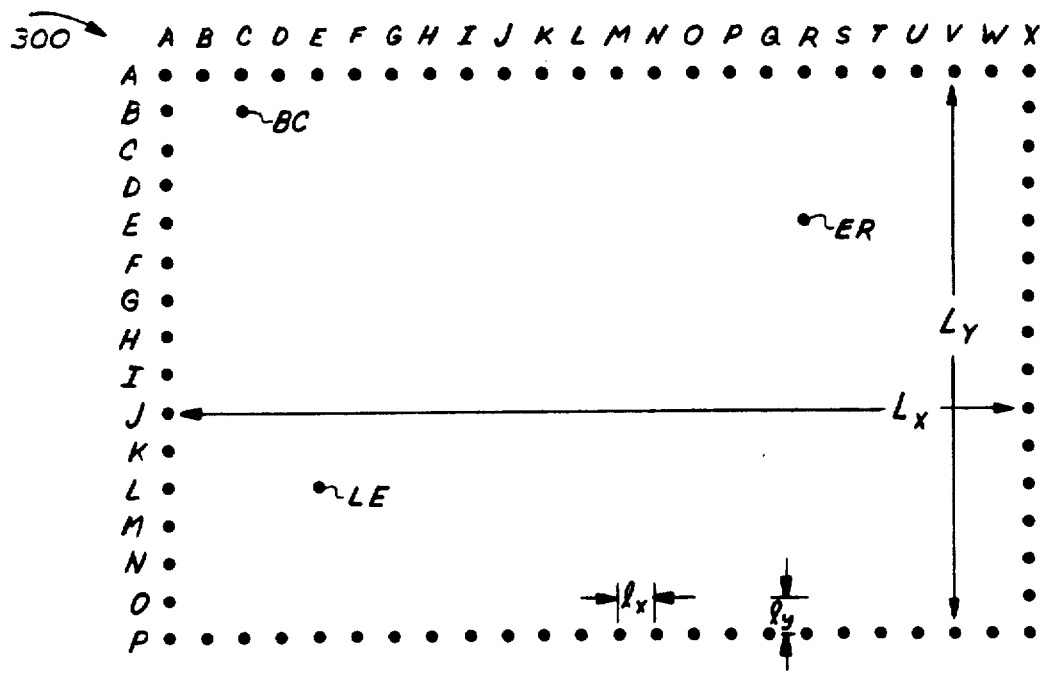
FIG. 3 illustrates array geometry in accordance with the present invention.

By way of introduction of the illustrated embodiment, the components shown in FIGS. 1-9 of the drawings have been assigned general reference numerals and a brief description of each such component is given in the following description. The components in each figure have in general been assigned three digit reference numerals wherein the hundreds digit of the reference numeral is related to the figure number where the components in FIG. 1 have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

The processing system of the present invention can take any of a number of possible forms. Preferred embodiments of several forms of the present invention are shown in the accompanying figures and will be described in detail hereafter.

A brief description will now be provided on well known holographic techniques to provide a better understanding of the improvements of the present invention. Holography may be related to coherent illumination, wherein coherent illumination is considered to be illumination that can generate interference patterns such as having wave fronts and phases preserved and consistent therebetween. When coherent illumination interacts with an object, interference patterns are generated which propagate through a medium such as water and are related to the configuration of the object. These interference patterns can be reconstructed for an image using various optical, analog, and digital techniques. One optical arrangement uses photographic film to record interference patterns, wherein illumination of the interference patterns on the film with a laser beam may be used to reconstruct the image. Further, various prior art analog signal processing arrangements have been configured for reconstructing an image from an interference pattern. Well known digital reconstruction techniques utilize an array of sensors to sample a holographic interference pattern for processing with an FFT algorithm to reconstruct the image from the sampled interference pattern. The present invention is directed to an improvement in such a digital arrangement.

An array of receivers is provided to sample an interference pattern at discrete positions. Illumination having interference patterns related to the illuminated environment are input to the array such as by projecting the interference patterns thereon, which may be accomplished by merely placing the array in the illumination to sample the effect of the illumination.

An interference pattern projected on an array may be in the form of signals having amplitude and phase characteristics related to the environment being illuminated. The array senses discrete points and may provide either amplitude or phase information or both, amplitude and phase information. Quadrature components of amplitude, often called complex amplitude or real and imaginary components of amplitude, also define the amplitude and phase relationships of a signal. As will be discussed hereinafter, resolution is related to the dimensions of an array and field-of-view is related to the spacing of elements in an array. These resolution and field-of-view characteristics are well known in the art and need not be discussed in detail herein. Simplified descriptions are provided so that general holographic concepts may be understood as a background for practicing the present invention.

The size of an array can be intuitively related to resolution. A small object in the illuminated environment projects an interference pattern on an array. The interference pattern will vary in phase and amplitude across the array. The greater the distance across the array, the greater will be the phase and amplitude changes in the interference pattern across the array.

The element spacing of an array can be intuitively related to field-of-view. Field-of-view is related to the angular region over which an interference pattern may be uniquely defined. It is well known that sinusoidal functions are repetitive for each wave length. Further, it is well known that the wave length component projected on a flat plane is a sinusoidal function of the angle of incidence of the illumination. Therefore, as the angle of incidence changes, the component of wave length projected on the array changes as a sinusoidal function thereof. When the component of wavelength is less than the array element spacing, an ambiguity of direction results.

The sampled interference pattern may be processed with well known electronic techniques. In a preferred embodiment described in detail hereinafter, each array element provides an analog signal proportional to the illumination sample where the analog samples are processed and converted in a digital computer. The reconstructed image may be displayed such as on a CRT to provide an operator with an image of the environment.

The system of the present invention is exemplified by the simplified block diagram shown in FIG. 1 for an acoustic imaging system 100. An acoustic transmitter 104 transmits an acoustic signal 105 which propagates through an acoustic medium such as water. When the transmitted signal 105 interacts with an object 106 or with an environmental discontinuity such as a density gradient, a reflected acoustic signal 107 is generated. A sensor array 110 such as a hydrophone or geophone array senses acoustic signal 107 with a plurality of acoustic transducers, wherein each of a plurality of transducer elements in array 110 generates an output signal 112. A channel processor 114 is provided to process transducer signals 112 in response to a reference signal and to provide processed transducer signals 116 that are related to an "interference pattern" of acoustic pressures detected by array 10. Multiplexer (MUX) 118 selects each of a plurality of array signals 116 in response to address signals $X_D$ and $Y_D$ for sequential output of array signals on line 121 as a multiplexed transducer signal.

Digital control counters 119 generate X and Y address counts $X_D$ and $Y_D$ to select an appropriate array signal X in a particular row Y. As control counters 119 sequence through a plurality of count conditions, the related processed transducer signals 116 are selected with multiplexer 118, generating multiplexed transducer signals 121 that are related to the sequential combination of selected transducer signals. An analog-to-digital converter (ADC) 122 converts analog signal 121 to digital signal 124.

A reconstructor 126 accesses the sequential combination of digital transducer signals 124 and processes the transducer signals with well known techniques such as with a Fast Fourier Transform (FFT) algorithm to generate an image for display. An array of points comprising a transformed image are used to excite an output device such as a CRT display, which will be described hereinafter with reference to FIG. 2B.

A single array channel is shown in detail in FIG. 2A. A single hydrophone element 210 in the hydrophone array 110 generates a hydrophone signal 211 in response to acoustic input signal 107 to channel processor 114. In a preferred embodiment, channel processor 114 may have a separate processing channel for each hydrophone element. One embodiment of a channel processor is shown in FIG. 2A comprising amplifier 212, demodulators 216 and 236 and filters 219 and 239. Hydrophone signal 211 is processed with amplifier 212 to generate a buffered hydrophone signal 214. Amplifier 212 may be any well known buffer amplifier such as an operational amplifier or a transconductance operational amplifier such as RCA circuit serial no. CA3080 for providing isolation and amplification for the low level hydrophone signal 211.

Amplified hydrophone signal 214 may be processed with phase sensitive demodulators (PSDs) 216 and 236, shown schematically as a switch controlled by reference signals 146 from reference generator 113. PSD output signals 218 and 238 are related to the in-phase and out-of-phase components respectively of hydrophone signal 214. Therefore, demodulated signals 218 and 238 have amplitudes that are related to an interference pattern generated by acoustic signal 107. PSD signals 218 and 238 are filtered with filters 219 and 239 respectively to generate output signals 215 and 235 respectively. PSDs 216 and 236 and filters 219 and 239 provide DC analog signals 215 and 235 respectively having amplitudes proportional to the in phase-component and the out-of-phase component respectively of the hydrophone signal 214. Filter 219 is shown in simple schematic form for illustration purposes having resistor 226 and capacitor 228. Other filter arrangements are well known in the art and may be used to implement filters 219 and 239. In addition, a well known integrator or a well known sample-and-hold circuit may be used in placed of filters 219 and 239 to provide DC analog signals 215 and 235 respectively.

In a preferred embodiment of channel processor 114, improved performance may be achieved by obtaining quadrature components of hydrophone signal 211. Therefore, a second signal processor channel may be provided for each hydrophone element 210 comprising PSD 236 and filter 239. A quadrature reference signal 237 is provided to PSD 236. Therefore, PSD output signal 238 is related to a quadrature component of the hydrophone signal 211 and output DC signal 235 is related to a quadrature component of hydrophone signal 211. Therefore, it can be seen that signals 215 and 235 represent the quadrature or the real and imaginary components of hydrophone signal 211, thereby preserving the phase and amplitude or complex amplitude information for improved image reconstruction.

The elements shown in FIGS. 1 and 2A are well known in the art and may take any of a number of forms. These elements will now be described for one embodiment of the present invention.

Transmitter 104 may be a well known sonar transmitter such as a piezo-electric ceramic plate which may be diced to supress resonances and may have other well known sonar transducer characteristics. The transmitter transducer may be a high drive ceramic such as PZT-8 and may be driven by a well known transmitter which modulates a carrier frequency with transmission pulses 145 to transmitter 104.

Hydrophone array 110 may be configured with a linear array, a 2 dimensional X-Y array, or other transducer array configuration. Various array embodiments will be discussed with reference to FIG. 3 hereinafter. Hydrophone array 110 may be configured with a plurality of hydrophone elements arranged in a linear array, a 2 dimensional rectangular array, a circular array or any other geometric pattern. For simplicity herein, hydrophone array 110 is assumed to be an X-Y rectangular array and in other embodiments may be shown as a linear array. The teachings of the present invention are relatively independent of the array pattern and may be used with a large number of array configurations.

Hydrophone elements 210 may be any well known acoustic transducers such as used in well known sonar systems, but in a preferred embodiment may be piezo-electric ceramic elements of a well known configuration. One well known ceramic material is PZT-5A. Individual hydrophones may be assembled into an array or a large ceramic element may be "diced" with well known techniques for providing a plurality of individual hydrophone elements. Electrodes are bonded to each hydrophone element with well known techniques such as thermocompression bonding techniques to provide hydrophone output signals 112 to channel processor 114.

Channel processor 114 is illustrated in simplified schematic form in FIG. 2A and has been briefly described above. The various elements including amplifier 212, demodulators 216 and 236, and filters 219 and 239 are well known circuit elements where many different configurations may be provided by those skilled in the circuit design art. A preferred embodiment of this arrangement is shown in copending patent application Ser. No. 438,328 filed on Jan. 31, 1974 now U.S. Pat. No. 3,897,753 issued on Aug. 5, 1975 showing a combined amplifier 212 and PSD 216 using an operational transconductance amplifier RCA circuit serial no. CA3080, which may be adapted to the channel processor of the present invention by those skilled in the circuit design art.

In a preferred embodiment, a reference generator 113 may be used to generate the transmission frequency to excite transmitter 104 and to provide the reference signals for the PSDs in channel processor 114. The reference signal may be amplified and used to drive a transmitter transducer with well known amplifier circuits for transmitting an acoustic pulse 105. As is well known in the art, a transmit command pulse 145 may be used to enable or to gate a reference signal 146 into a transmitter amplifier at the desired transmit time. Quadrature signals that are coherent with a reference signal may be generated with phase shift techniques to provide a quadrature signal 237 that is 90 degrees out-of-phase with a reference signal 217. In another embodiment, reference generator 113 may be implemented with a digital reference counter generating a pair of quadrature signals such as described in copending patent application CONTROL APPARATUS Ser. No. 135,040 filed on Apr. 19, 1971 which is incorporated herein by reference.

The frequency of output signals 146 from reference generator 113 may be fixed or may be controllable. In a controllable embodiment, well known controllable frequency generators may be used such as a variable frequency oscillator (VFO) or a voltage controlled oscillator (VCO). In another embodiment, a programmable rate multiplier such as the Texas Instruments Ser. No. 7497 integrated circuit may be used to provide a controllable output frequency. Controllable frequencies may be used to clock a quadrature counter arrangement, as described in the above reference application CONTROL APPARATUS, or may be filtered to provide the reference and the phase-shifted quadrature signal, or may be otherwise processed with well known techniques to provide the reference signal 217 and quadrature signal 237 having controllable frequencies. A controllable frequency characteristic of reference generator 113 may be used in a preferred embodiment of the present invention, which will be discussed in detail hereinafter.

Analog multiplexer 118 may be implemented with many well known analog multiplexer arrangements such as using digital logic to select one of a plurality of field effect transistor (FET) switches to conduct a particular analog signal through the FET switch to the output signal line 121. ADC 122 may be a well known successive approximation analog-to-digital converter or other well known converter arrangement. Datel Systems Inc. of Canton, Mass. manufactures a multiplexer model no. MM8 and manufactures ADC model nos. ADC-89 series, ADC-D series and other models which exemplify well known multiplexer and ADC devices.

Computer reconstructor 126 may be any of a plurality of different reconstructor arrangements that are well known in the art. In one embodiment, reconstructor 126 may be a special purpose (hardwired) FFT processor such as array processors manufactured by International Business Machines and by Raytheon and hardwired FFT processors manufactured by Spectra Data Co. of Northridge, Calif. In an alternate embodiment, reconstructor 126 may be a well known mini-computer such as manufactured by Data General Corporation as the Nova 1601, Digital Equipment Corporation as the PDP-11, Rolm Corporation as model 1602, and General Automation as the SPC-16. Such mini-computers may be programmed with well known FFT programs to convert the input raw hologram information to image intensity information that may be output for display as signals 128. In still a further embodiment, reconstructor 126 may be a multiprocessor arrangement, wherein each of a plurality of data processor implements a portion of an FFT algorithm.

In yet another embodiment of the present invention, reconstructor 126 may provide a correlation computation to correlate the input information 124 with reference information such as for providing a digital filtering operation or for correlating input information with a pilot operator related to the transmitted signal 105. Correlators are well known in the art and may be a properly programmed GP computer such as the SPC-16 in the CAFDRS system or may be hardwired special purpose correlators. The correlator may be a frequency domain correlator such as a GP computer programmed to perform an FFT computation, an array multiplication in the frequency domain, and an inverse FFT computation. Alternately, real time correlators are known in the art such as performing multiplication and shifting operations to implement a correlation algorithm.

Output device 129 may be a display arrangement such as a well known CRT display. One embodiment of a CRT display arrangement will now be discussed with reference to FIG. 2B.

An array of digital intensity points comprising a transformed image is used to excite a CRT display. These intensity points are loaded into refresh memory 241 from reconstructor 126. Image points are sequentially selected from refresh memory 241 under control of counters 119 which select the element in a row (X-address) and the particular row (Y-address). Refresh memory 241 operates in response to the X and Y address to output a stored digital display signal 242 that is related to the intensity of a display point in the X-column and Y-row as addressed by control counters 119. The selected image point is converted from a digital signal 242 to an analog signal 246 with digital-to-analog converter (DAC) 244. CRT display 248 generates an intensity display point having an amplitude related to the analog intensity signal 246.

Steering of the CRT display beam is performed with X-DAC 250 and Y-DAC 251 to generate X and Y analog steering signals $X_A$ and $Y_A$ in response to digital control counter signals $X_D$ and $Y_D$ 120 respectively. Therefore, while control counters 119 increment through addresses of display points, the appropriate point intensity parameter is accessed from refresh memory 241 and the row and column addresses or positions on the display for that point are used to control the CRT display beam position to illuminate a point on the CRT display having an intensity determined by signal 246 and having a position determined by the $X_A$ and $Y_A$ steering signals.

In an alternate display embodiment, CRT display 248 may have image storage capability, thereby eliminating the need for refresh memory 241. CRT storage displays and their use are well known in the art, such as the Tektronix model no. 601 CRT storage display.

Display arrangement 240 provides a continuous refresh of a CRT display 248 to maintain intensity of the display and to update the display as a function of the changing environment. In an alternate embodiment, a storage CRT may be used where the display may be stored substantially indefinitely without being refreshed to reduce the requirement for continuous generation of acoustic pulses. In still another embodiment, a refresh memory may be used to store a particular image and to continuously refresh the display to provide a static display of a particular environment.

Display output device 129 may be presented with flexibility of display well known in the CRT field. For example, displays 500 and 600 discussed in detail hereinafter may be provided with dimensional scale factors that show them in approximately square form as shown for display 500 or in rectangular form as shown for display 600 or in any convenient dimensions and sizes; achieved by defining the scale factors for each axis of the CRT display. Further, other techniques may be used such as presenting displays 500 and 600 together on the same CRT display having comparable range and heading scale factors so that display 600 may merely appear as another sector to the right of sector 527 for convenience of lining-up and matching corresponding images 530 with 630 and 532 with 632.

Operator input device 127 may be any well known input device such as those used with well known computers. These input devices include a Teletypewriter ASR-33 manufactured by the Teletype Corporation, a CRT terminal such as manufactured by Tektronix, thumbwheel switches, a keyboard, or other well known input device. For the system of the present invention, the operator input device 127 will be exemplified with thumbwheel switches 810 and 812 shown in FIG. 8 for simplicity of discussion.

The computer reconstructor 126 interrogates operator input device 127 to load input data and commands, then performs the required operations as is well known in the computer art.

In many applications, illumination that is incident on an array may not be reflected illumination from a transmitter associated with the array as described with reference to FIG. 1, but may be illumination transmitted from an object that is to be located or identified. For example, in electronic countermeasures associated with radar systems it may be desired to locate and identify a source of transmission of radar signals. Similarly, in underwater systems it may be desirable to locate and identify a source of sonar signals. Therefore, the present invention does not require a transmitter of illumination signals to be included in the system, but merely provides a transducer array and signal processing electronics for viewing the incident energy.

In the prior art, receivers have been implemented to receive illumination from external sources to locate and identify the source. Such arrangements use well known techniques such as implemented in radar and sonar systems, evaluating characteristics of the received illumination such as frequency, pulse width, pulse rate, and other such well known characteristics. The system of the present invention provides for evaluating complex-amplitude or amplitude-phase characteristics of received illumination and therefore is able to obtain precise information on location and shape of a transmitter. Shape may be characterized by illumination dimensions, symmetry, relative dimensions, side lobe pattern, and other such well known transmission characteristics.

The Fast Fourier Transform (FFT) is a well known algorithm for converting between the frequency and the time domain. The FFT algorithm may be used to transform samples of a waveform that are a function of time or may be used to transform samples of an interference pattern taken across a transducer array in accordance with the present invention. Still further, well known implementations of the FFT algorithm permit implementation of a multi-dimensional algorithm for a multi-dimensional array such as performing the FFT algorithm in a first dimension such as the row dimension, then performing the FFT algorithm in a second dimension such as the column dimension, then processing the interaction between these dimensions such as by adding the solutions for each dimension of FFT processing derived for each point.

The FFT algorithm and implementation thereof are well known in the art as discussed in the references set forth hereinafter.

One FFT algorithm is the Cooley-Tukey algorithm which is discussed in the reference Acoustic Imaging by Computer Reconstruction.

The FFT algorithm may be implemented on well known data processors such as array processors, special purpose (hardwired) FFT processors, and stored program general purpose computers. For example, array processors are manufactured by International Business Machines and by Raytheon Corp.; hardwired FFT processors are manufactured by Spectra Data Corp. of Northridge, Cal., and Interstate and Electronics Corporation of Anaheim, Cal.; and General Purpose Computers being programmed to implement the FFT algorithm are manufactured by General Automation of Anaheim, Cal.

The FFT algorithm permits processing independent of the time between samples, the spacing between array elements, the number of samples, the size of an array, and other such parameters. A specific FFT algorithm may be adapted for the particular parameters of the system such as the array size by those of ordinary skill in the art. Further, a plurality of parameters such as the number of samples or a single FFT algorithm may be provided having a plurality of parameters depending upon the mode of operation or the type of information being processed. Therefore, the present invention will be discussed relative to the array characteristics, wherein one of ordinary skill in the art can adapt well known FFT algorithms to process the information samples from the particular array configuration.

In accordance with another feature of the present invention, the array configuration may be changed by (1) changing the frequency of the illuminating signal or (2) selecting samples from certain array elements to be included in an FFT computation and non-selecting samples from other array elements to be excluded from the FFT computation. In an embodiment wherein the illuminating frequency is varied, as controlled with reference generator 113, a frequency signal 144 may be provided to computer reconstructor 126 to define the frequency related dimensions of the array. Also, the selected and non-selected transducer signals for FFT processing (1) may be determined by a well known table lookup operation in computer reconstructor 126 that is a function of the mode of operation, (2) may be input by an operator using well known input devices such as an ASR-33 teletypewriter, or (3) may be selected in other well known arrangements.

Transmitter Location

In one application, the system may be arrangement identify the location of a transmitter wherein transmitter 104 and reference generator 113 are located remote from the receiver subsystem and wherein the receiver subsystem may include array 110, channel processor 114, multiplexer 118, ADC 122, reconstructor 126 and associated devices. It should be noted that the transmitter location device provides illumination 105 and 107 from transmitter 104 to array 110 without the necessity of a reflector 106. In such an application, the transmitter may be an underwater sonar source in an undersea application, an underground vibration transducer in a geophysical application, or a transmitting aircraft system in an airborne application. The receiving subsystem may be arranged to receive and analyze the signals from transmitter 104 to determine the location of transmitter 104. It should be noted that reference generator 113 shown as generating phase signals 146 to both, transmitter 104 and channel processor 114, may be implemented as a transmitter reference generator for exciting the transmitter 104 located with the transmitter and a receiver reference generator for exciting channel processor 114 located with the receiver subsystem. The reference signal to the transmitter 104 and the reference signal to the channel processor 114 need not be phase locked, where the phase across array 110 relative to the transmitted signal 105 does not determine angular position but where the component of the wavelength projected on array 110 determines the angular position.

To exemplify the transmitter location feature of the present invention, a geophysical application will be described. In the oil exploration field, an oil well may be drilled to great depths but the precise location of any point in the drilled hole and the direction of the drilled hole is not always known. In the present embodiment, a transmitter transducer may be lowered into an oil well hole to a prescribed depth and may be excited to generate vibration signals that may be coupled into the geophysical environment to propagate to the array 110. In another embodiment, the oil well casing or the drill pipe attached to the drill bit may be excited with acoustic signals for propagation into the oil well and for coupling into the geophysical environment. Other excitation and coupling techniques will now become obvious to those skilled in the art. Array 110 may comprise a line array 311 or an area array 300.

As described under multiple source ambiguity herein, a single source reduces ambiguity so that a single line array and a single column array are sufficient to determine location in two dimensions, with the time domain providing the third depth dimension. As described herein, a linear array can determine the angular position of an object in the dimension of the array, where the cross dimension perpendicular to the line of the array will be compressed into a projection on the line array; thereby having ambiguity of object location in that cross direction. This cross dimension ambiguity is resolved with a line array in the cross direction, which will determine the position of an object in the dimension of the array along the cross direction.

If a plurality of objects are viewed with a pair of row and column line arrays, the plurality of objects would be presented in each, the column array and the row array; but it might not be possible to match up the objects in the row array with the corresponding objects in the column array without further information. If range information were available and if all of these objects were at different ranges, the range information would then be sufficient to resolve ambiguity associated with multiple objects. In the present example, a single transmitter is assumed to provide a single object, thereby eliminating any ambiguity in using row and column line arrays. A further simplification may be provided by implementing a single line array such as in the row direction and defining a first angular position of the transmitter, then reorienting the line array such as by relocating geophone array elements in the cross direction or column direction and then determining a second orthogonal angular position of the transmitter in a direction orthogonal to the first array position.

To exemplify the transmitter location feature of the present invention, line 436 is shown in FIG. 4 representing an oil well having a vertical down component from system 100 to point 437, then branching off at an angle from point 437 outward through the interface between sectors 423 and 424 to bottom point 438. In one embodiment, a drilling pipe extending from system 100 to the bottom of the hole shown as point 438 is excited with vibrations which are coupled into the underground environment and which propagate to system 100. As time progresses and as range line 452 moves downward in depth, the location of the oil well hole may be displayed as shown in FIG. 5 with line 536 progressing vertically downward through sector 523 to point 537 and then progressing downward at an angle crossing the interface between sectors 523 and 524 to the end of the pipe and the bottom of the hole shown at point 538. In an alternate embodiment, a transmitter transducer may be lowered into the oil well hole, where position readings may be taken at various depths and where an oil well location line 536 may be plotted as a sequence of points at various depths, thereby deriving a plot or a display of the oil well 536.

Array Considerations

An input transducer array 300 is shown in FIG. 3, where each array point is used to represent an input transducer such as a hydrophone in an underwater acoustic imaging system. The array shown in FIG. 3 is a 24 by 16 transducer array with 24 columns and 16 rows. A notation will now be described to simplify the discussion relative to array 300. Each of the 24 columns is labeled with an alphabetical notation A through X. Similarly, each of the 16 rows is labeled with an alphabetical notation A through P. Therefore, an element can be identified by the related row and column in which it is positioned. For example, element BC is positioned in row B and column C, element ER is positioned in row E and column R and element LE is positioned in row L and column E. Similarly, all of the other elements in array 300 are identified with alphabetical row notations A through P followed by alphabetical column notations A through X. For simplicity, elements internal to array 300 may not be shown as dots but may be implied by the intersection of a row and a column and being identified by the related alphabetical notations.

The angular resolution of an array may be defined by the array dimensions as shown in equation 1

$$\sin d\theta = k_1(\lambda/L) \qquad \text{equation 1}$$

where $d\theta$ is the angular resolution of the array, $\lambda$ is the wavelength of the illumination, and L is the width of the array. This equation is a first order approximation of the resolution. It is a well known equation and therefore need not be derived herein. As an example, if element spacing l in the array is constant, the angular resolution in the horizontal direction is related to the wavelength λ divided by the array dimension $L_x$. Similarly, the angular resolution in the vertical direction is related to the wavelength λ divided by the array dimension $L_y$. Therefore, the resolution is relatively independent of the spacing of array elements, of the number of array elements, and of other such considerations; where the resolution is primarily related to the array dimension in a particular axis. If the horizontal spacings between elements is the same, then the resolution in the horizontal direction $L_x$ will be 50% greater than the resolution in the vertical direction $L_y$ because there are 50% more elements in the horizontal direction $L_x$ than in the vertical direction $L_y$, thereby providing a 50% greater resolution in the horizontal direction.

The array field-of-view of an array may be defined by the array element spacing as shown in equation 2.

$$\sin \phi = k_2(\lambda/l) \qquad \text{equation 2}$$

wherein φ is the angular field-of-view, λ is the wavelength of the illuminating signal, and l is the element spacing. It should be noted that the array will accept illumination from the illuminated environment, where field-of-view is related to the region in which ambiguity of returns can be resolved. For example, array 300 will sense an interference pattern projected thereon having phase and amplitude relationships. If a component of wavelength projected on array 300 is greater than the transducer spacing, then the direction can be determined without ambiguity. If a component of wavelength projected on array 300 is less than the transducer spacing, then the direction introduces ambiguity. Therefore, field-of-view is related to the element spacing l and is relatively independent of array dimensions or other array characteristics.

As discussed above, the array resolution is related to array dimensions (L) and the array field-of-view is related to element spacing (l). In the prior art, it has been considered that the number of elements are defined by the resolution related array dimension (L) divided by the field-of-view related element spacing (l). For example, if the element spacing were required to be one centimeter for field-of-view considerations and the array dimensions were required to be 100 centimeters for resolution considerations, then the array would have 100 elements in the particular direction. Further, the prior art has required that an array be substantially complete, having transducer elements in each array location. In the system of the present invention, an array may be configured having sub-arrays, where a first sub-array 311 provides a desired element spacing for field-of-view considerations and a second array 312 provides a desired array demension for resolution considerations; wherein the intermediate elements of the second array AH and AP are located to provide sufficient field-of-view for resolution of the ambiguity associated with the first array 311. A simple example would be provided to exemplify this teaching of the present invention, being a plurality of sub-arrays for providing different information. For example, sub-array 311 provides a wide field-of-view image to generally locate an object and to resolve the ambiguity of the object location while sub-array 312 provides high resolution images for precise location and identification of an object but having ambiguity of location due to a narrow field-of-view.

It should be understood that input signals are obtained from the total environment that is illuminated by the transmitter. The field-of-view parameter defines the angular region that provides non-ambiguous signals. If an environment greater than the field-of-view is illuminated, input signals will have ambiguity as to which field-of-view "sector" is providing the input signal, as will be discussed with reference to FIG. 4. The total environment that is illuminated by the transmitter is shown as θ and each field-of-view sector is shown as dθ sectors. An array having a field-of-view of dθ receiving input signals from illuminated environment θ will receive all of the signals from environment θ; where the plurality of sectors 420-427 will appear to be superimposed. This can be seen with reference to FIGS. 4-6. FIG. 4 shows an environment composed of field-of-view segments 420-427 and objects 430 and 432. FIG. 5 shows a wide field-of-view, low resolution display 500 of the environment which has display segments 520-527 corresponding to environment segments 420-427 respectively. FIG. 6 shows a narrow field-of-view, high resolution display 600 of the environment with all environment segments superimposed. Object 430 in segment 422 is shown on display 500 as image 530 in segment 522 and on display 600 as image 630. Object 432 with part 433 in the left part of segment 425 and part 434 in the right part of segment 424 is shown on display 500 as image 532 with image part 533 (corresponding to object part 433) in the left part of segment 525 and image part 534 (corresponding to object part 434) in the right part of segment 524 and is further shown on display 600 as image 632 with image part 633 (corresponding to object part 433) in the left part of segment dθ and image part 634 (corresponding to object part 434) in the right part of segment dθ. To illustrate the low resolution nature of display 500, image 530 is shown overlapping into segment 521 and images 530 and 532 are shown as low resolution images with low density resolution lines and with poor shape resolution. To illustrate the high resolution nature of display 600, images 630 and 632 are shown as high resolution images with high density resolution lines and with good shape resolution.

Display 500 shows all segments 520-527, corresponding to environment segments 420-427, respectively, as individual segments consistent with the non-ambiguous nature of a wide field-of-view display. Display 600 shows all segments superimposed in one dθ segment consistent with the ambiguous nature of a narrow field-of-view display. The form of the ambiguity can be seen in FIG. 6 where elements 420, 421, 423, 426 and 427 do not contribute to the display because they do not contain illuminated objects, image 630 in the left hand portion of display 600 corresponds to object 430 in the left hand portion of sector 422, image 633 in the left hand portion of display 600 corresponds to object part 433 of object 432 in the left part of sector 425 and image 634 in the right part of display 600 corresponds to object part 434 of object 432 in the right part of sector 424. Therefore, it can be seen that sectors 420-427 have field-of-view ambiguity in display 600 and show sectors 420-427 as being superimposed.

Range and field-of-view considerations will now be discussed relative to FIG. 4. A holographic system 100 may be considered to be located at the apex of an illuminated environment 400, where the illuminated environment is defined by angle θ, and having objects 430 and 432 located therein. The environment may be illuminated by a transmitter 104 in system 100 for generating an acoustic pulse having coherent characteristics. The transmitted pulse propagates outward, illuminating the environment defined by angle $\theta$. As time increases, the transmitted pulse propagates radially outward along radial lines such as line 450 in a direction defined by arrow 451. When the transmitted pulse encounters an underwater object such as objects 430 and 432, acoustic energy is reflected and propagates back towards system 100. Reflected acoustic energy is incident upon an array 110 of acoustic transducers 210, providing an interference pattern related to the objects 430 and 432 in environment 400.

The propagation velocity of acoustic waves may be assumed to be 5 feet per millisecond or 0.2 milliseconds per foot. Therefore, at any instant of time, the transmitted pulse will be illuminating the environment at a particular range such as range position 452 related to the closest point of object 432. As the transmitted pulse continues to propagate in direction 451, thereby illuminating objects at greater ranges, reflected energy from object 432 at range position 452 propagates towards system 100 at the same 5 feet per millisecond velocity. In order to receive reflected energy, the energy must propagate outward to the reflecting object and back to the array. The time from transmission to receipt of reflected energy is based upon the time to propagate outward at 0.2 milliseconds per foot and the time to propagate back toward the array at 0.2 milliseconds per foot for a total of 0.4 milliseconds per foot of range for a transmitted signal to propagate outward to an object and for a reflected signal to propagate back to the system 100. A sonar foot will be defined as the time required to propagate outward and back at 0.4 milliseconds per foot, which is 2.5 sonar feet per millisecond. Therefore, it can be seen that the return signal received by the system 100 is related to a range that is a function of time from transmission of the illuminating pulse, where each millisecond of time delay from transmission is related to 2.5 sonar feet of range (incident plus reflection propagation times) and uniquely defines the range of the increment of the environment being viewed. For example, if the leading edge of object 432 is viewed after 100 milliseconds of time from the transmission of an illuminating pulse, then the leading edge of object 432 at range position 452 must be at a range of 250 feet. Therefore, the acoustic return signal received by system 100 is related to increasing range at a rate of 2.5 feet per millisecond.

Field-of-view considerations will now be discussed with reference to FIG. 4. For example, if array 110 in system 100 has a field-of-view defined by $d\theta$, then system 100 will be able to define the heading of a detected object within the $d\theta$ field-of-view, but will have ambiguity of heading determination as to which $d\theta$ sector of the environment $\theta$ is providing the return. This is due to the multi-valued nature of sinusoidal functions characterizing interference patterns. If transmitter 104 in system 100 illuminates only a single $d\theta$ sector, then the return signals must be received from the illuminated $\theta$ sector and therefore the heading of the returns can be defined within that $d\theta$ sector without ambiguity. If the transmitter illuminates an environment larger than a $d\theta$ sector such as defined by angle $\theta$, then the array will not be able to define which sector contains the object; causing heading ambiguity. The array in system 100 will view the environment within the field-of-view $d\theta$ as if each of the sectors 420-427 were superimposed, as described with reference to FIG. 6 herein.

A display arrangement having a wide field-of-view and low resolution is shown in FIG. 5 corresponding to the environment discussed with reference to FIG. 4. Display 500 may be a CRT display as discussed above. The horizontal dimension is defined as the asmuth axis and covers the complete field-of-view defined by the angle $\theta$. The wide field-of-view $\theta$ is divided into eight $d\theta$ sectors 520-527 corresponding to sectors 420-427 shown in FIG. 4. Similarly, object 430 is displayed as image 530 and object 432 is displayed as image 532. Image 530 is shown substantially completely in sector 522 corresponding to object 430 being completely in sector 422. Due to the low resolution of display 500, object 530 is shown in low resolution form and may have display portions overlapping into sector 521 as shown in FIG. 5. Object 432 overlapping sectors 424 and 425 is shown as image 532 overlapping sectors 524 and 525 respectively; where object 532 is shown in low resolution form thereby obscuring precise position and shape information. Display 500 is shown having an image line 548 propagating outward along range line 550 in direction of increasing range 551. As the range line 548 passes a range position 552 and interacts with object 532, display points related to the returns from object 532 are provided to illuminate range line 552 on the display at the angular heading position from which the acoustic returns are received, which is the start of object 532 approximately inbetween sectors 524 and 525. As the image line progresses in direction 551, acoustic returns received by the array 110 and reconstructed by the system 100 are used to illuminate the display at the range line corresponding to the time that the return is received. Images are shown as a plurality of horizontal lines corresponding to range lines and having a spacing or resolution therebetween related to the reconstruction time. Therefore, if reconstruction time is one millisecond, this corresponds to a range resolution of 2.5 feet based upon the 2.5 feet per millisecond sonar range consideration discussed above. Therefore, the horizontal lines making up images 532 and 530 would be spaced at 2.5 feet equivalent range intervals therebetween.

After the image line has propagated to the maximum range at the top of the display, another pulse may be transmitted to again illuminate the underwater environment. The image line will again begin at the bottom of the display and propagating upward to the top of the display, illuminating objects defined by received and reconstructed returns.

A high resolution narrow field-of-view display will now be described with reference to FIG. 6. A display 600 having a narrow field-of-view $d\theta$ shows objects 432 and 430 as images 632 and 630 respectively, wherein illuminated segments 420-427 and displayed segments 520-527 are superimposed in display 600. Because object 430 is completely within sector 422, object 430 is displayed as image 630 completely within the displayed sector 600. Because object 532 is inbetween two sectors with portion 434 in the right hand portion of sector 424 and portion 433 in the left hand portion of sector 425; therefore corresponding display 600 shows image part 634 in the right part of sector $d\theta$ and image part 633 in the left part of sector $d\theta$, respectively. Display 600 is shown having the same characteristics as discussed for display 500 except having a narrower field-of-view $d\theta$ and a higher resolution for displayed objects 632 and 630. For example, display 600 is generated by a range line propagating from the bottom of the display to the top of the display at an equivalent velocity of 2.5 feet per millisecond having image lines displayed with a range resolution of 2.5 feet.

It can be seen from equations 1 and 2 that both, resolution and field-of-view, are directly proportional to the wavelength and therefore are inversely proportional to the frequency of the illuminating signal. Therefore, it can be seen that a decrease in frequency will increase the angular resolution and will increase the angular field-of-view. It is desired to have a small resolution and a wide field-of-view. Decreasing frequency will degrade resolution but will improve field-of-view and conversely. As discussed above, an arrangement with images having (1) wide field-of-view with low resolution and (2) narrow field-of-view with high resolution can be combined to provide high resolution images and reduction of position ambiguities. An arrangement has been discussed for selecting array elements having the correct separation and spacing to provide the desired resolution and field-of-view characteristics. Similarly, illumination signal frequency can be controlled to provide the desired resolution and field-of-view characteristics.

Use of a frequency modulated transmitter permits independent control of resolution and field-of-view, where the system can select either of a plurality of frequencies to generate the desired information. For example, a plurality of illuminating pulses can be transmitted wherein a first transmitted pulse has a first frequency that is high enough to provide the desired resolution and a second transmitted pulse has a frequency that is low enough to provide the desired field-of-view. Alternate pulses may be transmitted having the above frequencies to provide the desired information. The reference generator 113 can be controlled to have an output frequency related to the illuminating frequency. In one embodiment, the modulating frequency may also be used as the reference frequency. Therefore, as the modulating frequency is changed, the reference frequency is automatically changed.

A simplified example of the teachings of the present invention will now be discussed with reference to FIGS. 4–6. FIG. 4 shows an environment 400 being illuminated by a transmitter for providing returns to an array. The transmitter is assumed to illuminate the environment $\theta$, wherein the environment contains two objects, a first object 430 in sector 422 and a second object 432 having an object part 434 in sector 424 and an object part 433 in sector 425. A system 100 receives acoustic signal returns 107 from objects 430 and 432, provides processing and reconstruction, and displays the reconstructed images. Array 110 in system 100 contains two sub-arrays. A first sub-array 311 has a wide field-of-view $\theta$ and a low resolution related to closely spaced array elements having a small maximum dimension. A second sub-array 312 has a narrow field-of-view $d\theta$ and a high resolution related to widely spaced array elements AA, AH, AP and AX having a large maximum dimension $L_x$. A computer reconstructor 126 reconstructs the images from each sub-array 311 and 312 to provide displays 500 and 600 respectively.

FIG. 4 shows range along radial line 450, illuminated environment as $\theta$, and field-of-view segments as $d\theta$. The environment shown in FIG. 4 is shown in display form in FIGS. 5 and 6. For simplicity, the displayed horizontal dimension is shown as the angular field-of-view $\theta$ and $d\theta$. The range dimensions for displays 500 and 600 are shown as range lines 550 and 650, respectively, corresponding to range line 450. Further, sectors 520-527 in FIG. 5 correspond to sectors 420-427 in FIG. 4. Still further, display 600 represents the superimposed images from sectors 420-427 shown in FIG. 4 and sectors 520-527 shown in FIG. 5. The primary differences between displays 500 and 600 is that display 500 shows the full field-of-view $\theta$ without position ambiguity but with low resolution while display 600 shows the total field-of-view $\theta$ with sector ambiguity and with high resolution. Sector ambiguity is herein intended to mean that it is not readily apparent as to which sector the image is related to.

As the transmitted wave progresses through the environment from the center of the arc shown in FIG. 4 outward along range line 450, it illuminates objects at ranges that are a function of time. The computer reconstructor 126 reconstructs a line image after each interval of time for a particular range as the range associated with the return signal 107 increases as the transmitted signal propagates radially outward into the environment. As the return signals from object 432 illuminate the array, the reconstructor generates line images for presentation on displays 500 and 600, successively building up an image of the environment from the bottom of the display and progressing toward the top of the display; where a line image is provided for each range increment. For display 500, the full field-of-view $\theta$ is displayed, but objects 430 and 432 are presented with low resolution. Therefore, it can be seen that objects are present having a particular range in the vertical direction and heading in the horizontal direction, but the size and shape of those images cannot be easily recognized due to the low resolution of display 500.

Display 600 provides images having high resolution but having sector ambiguity. A comparison of displays 500 and 600 shows the location of object 430 as images 530 and 630 respectively. Image 530 can be recognized based upon range and heading characteristics and image 630 can be recognized based upon range and shape. Image 532 can be distinguished from image 530 based upon range and azimuth or heading distinctions in display 500 and image 632 can be distinguished from image 630 based upon range and shape distinctions in display 600. Therefore, the combination of displays 500 and 600 permits the matching of images 530 and 630 and images 532 and 632 based upon range discrimination to resolve field-of-view ambiguity of display 600 and to overcome resolution limitations of display 500. Further, display 500 may be sufficient to show that image 532 is composed of image part 534 in the right part of sector 524 and image part 533 in the left part of sector 525, where the left edge of image part 533 is connected to the right edge of image part 534. From this observation, it becomes apparent that object 632 should have edge 636 of image part 634 attached to edge 638 of image part 633 to show the complete image 632 in a high resolution form.

In view of the above, a small closely spaced sub-array 311 having a wide field-of-view used in conjunction with a large widely spaced sub-array 312 having high resolution can be combined to provide both, high resolution and reduction of field-of-view ambiguity, without the necessity of populating all positions in a single array having the wide field-of-view and the high resolution of the two sub-arrays. Further, sub-arrays 311 and 312 may be generated by selecting holographic signals from selected elements in array 300, providing the advantage of rapid reconstruction due to the small numbers of array elements yet still providing high resolution and wide field-of-view. After objects are located with displays 500 and 600, a standard acoustic imaging approach using a complete array such as array 300 having a range gate to select an image at a particular range can then be used to provide precise two-dimensional image information to obtain precision cross-sections of the selected object.

In accordance with the present invention, array 300 may be restructured into sub-arrays 311 and 312 to provide advantages such as reduced number of channels and the associated reduction in channel hardware and reconstruction time. Reorganization of array 300 into sub-arrays 311 and 312 may be provided in several ways including selection of particular sub-array signals from elements in a full two-dimensional array 300 or implementation of sub-arrays 311 and 312 in place of array 300 or in addition to array 300. Array implementation will be discussed in detail hereinafter.

As discussed above, array 300 has a resolution that is related to the dimension $L_x$ and $L_y$ of array 300, wherein resolution in the X-direction is defined by the $L_x$ dimension and resolution in the Y-direction is determined by the $L_y$ dimension. Further, array field-of-view is based upon spacing of array elements, wherein X-dimension field-of-view is based upon the $l_x$ spacing and the Y-dimension field-of-view is based upon the $l_y$ spacing of the array elements. For the present example, the $L_x$ dimension shall be considered to be the heading dimension and the $L_y$ dimension shall be considered to be the depth dimension.

In accordance with the present invention, one or more sub-arrays 311 and 312 may be provided for improved resolution or field-of-view or both, resolution and field-of-view, but without requiring a large number of array elements. For example, a line array may be provided to generate image information having a single dimensional image, wherein the second dimension is compressed to provide superimposed image information, as will be discussed hereinafter. Such a line array may be provided by selecting a row of elements such as the 24 elements in row A of array 300 to provide non-ambiguous heading images but having depth ambiguity or may be generated by selecting a column of elements such as the 16 elements in column A of array 300 to provide non-ambiguous depth images but having heading ambiguity.

The line array arrangement discussed above can be further improved by providing sub-arrays 311 and 312 in place of a line array such as row A. Because resolution is related to the extreme dimensions $L_x$ and $L_y$ of the array, a resolution equivalent to the row resolution of array 300 could be achieved by use of elements AA and AX in row A, shown as the extreme elements in sub-array 312. Because field-of-view is related element spacing $l_x$ and $l_y$, a field-of-view equivalent to the row field-of-view of array 300 could be achieved by using any two closely spaced adjacent elements such as elements AA and AB having spacing $l_x$. Therefore, sub-arrays having elements AA and AX and elements AA and AB will provide the simplest configuration, which is the extreme case of one embodiment of the present invention.

As will be described hereinafter, sub-arrays 311 and 312 having more than two elements per sub-array will be used to better exemplify the present invention. In this example, a wide field-of-view sub-array 311 is shown having eight elements AA-AH to provide the full field-of-view of line array 300 row A based upon element spacing $l_x$ but having only one-third of the resolution of line array 300 row A because the dimension of sub-array 311 is only one-third of the dimension of line array 300 row A. Similarly, a high resolution sub-array 312 is provided having four elements AA, AH, AP and AX to provide the full resolution of line array 300 row A based upon the spacing $L_x$ between elements AA and AX but having only one-eighth the field-of-view of line array 300 row A or of sub-array 311. As will be discussed in detail hereinafter, sub-array 312 has intermediate array elements AH and AP which had substantially no effect on resolution, defined by array extreme elements AA and AX, but which increases the field-of-view to being one-eighth of the field-of-view of sub-array 311 instead of 1/24 of the field-of-view of sub-array 311. Therefore, it can be seen that sub-array 311 has ⅓ the resolution of sub-array 312 but eight times the field-of-view of sub-array 312 and wherein the combination of sub-array 311 and sub-array 312 provides a field-of-view and a resolution equivalent to that obtained with line array 300 row A.

As discussed above, a reduction in the number of elements of sub-arrays 311 and 312 could be achieved such as with the use of two element sub-arrays or with the use of square sub-arrays having 5 elements each or by other arrangements. For the present example, a two element sub-array 311 would have such low resolution that it would be difficult to determine the precise location and configuration of an object and therefore make it more difficult to correlate images from sub-arrays 311 and 312 in FIGS. 5 and 6 respectively. Similarly, sub-array 312 could be reduced to a two element array, but this would require 24 sectors instead of eight sectors to cover the field-of-view $\theta$ of sub-array 311; which would complicate the example discussed with reference to FIGS. 4–6 by requiring 24 sectors in FIGS. 4 and 5. Still further, particular advantages are obtained from using numbers being related to exponents to the base 2, as is well known in the logical design art, wherein the four elements in sub-array 312 and the eight elements in sub-array 311 are binary exponential quantities and are configured in as "square" a sub-array configuration as possible consistent with having such binary characteristics.

Sub-arrays 311 and 312 may have elements that are common therebetween and further may have elements common to array 300. Although array 300 and sub-arrays 311 and 312 may be implemented as individual arrangements of completely independent elements, in a preferred embodiment elements may be common to a plurality of arrays. For example, sub-arrays 311 and 312 may be implemented as a single line array having only ten elements AA-AH, AP and AX. Separation into two sub-Arrays 311 and 312 may be performed in the electronic domain such as with reconstructor 126 selecting signals from elements AA-AH to provide a wide field-of-view, low resolution display 500 and selecting information from elements AA, AH, AP, and AX to provide a high resolution, narrow field-of-view display 600. Further, sub-arrays 311 and 312 may be used in conjunction with array 300 for different modes of operation such as for searching for an object with sub-arrays 311 and 312, then for precisely interrogating an object with the full array 300. In such applications, sub-arrays 311 and 312 may not be physically separated from array 300 but may be implemented by using information from selected elements such as elements AA-AH, AP and AX out of the 384 elements of array 300 to perform the reconstruction computations. For example, reconstructor 126 may select information from eight elements AA-AH out of the 384 elements of array 300 to reconstruct each range line image for display 500 and may select information from four elements AA, AH, AP, and AX out of the 384 elements of array 300 to reconstruct each range line image for display 600, disregarding the information from the non-selected elements.

The system of the present invention can provide substantial array efficiencies. These array efficiencies may be used to reduce the hardware, such as the number of array elements and the signal processing electronics associated with each element, and may further reduce reconstruction time, where the reconstruction time is related to the number of elements in the selected array that is processed.

An example will now be provided to illustrate array efficiency. An array having rows of 256-elements and columns of 64-elements will be considered to exemplify the system of the present invention. This array has 16,384-elements (256×64). The use of line arrays in the respective directions will reduce the array elements to a 256-element line array and a 64-element line array for a total of a 320-element array (256+64), which is only about 2% of the 16,384-element array. Further, the 256-element array may be configured as two sub-arrays including a 16-element high resolution, narrow field-of-view line sub-array and a 16-element low resolution, wide field-of-view line sub-array. Similarly, the 64-element line array may be configured as an 8-element high resolution, narrow field-of-view line sub-array and an 8-element low resolution, wide field-of-view line sub-array. Therefore, this arrangement would have 48-elements comprising two 16-element sub-arrays and two 8-element sub-arrays. These 48-element arrays require only about 15% of the elements in the 320-element arrays and only 0.3% of the elements in the 16,384-element array. Therefore, substantial improvements in array complexity or reconstruction complexity or both, array complexity and reconstruction complexity, may be achieved by utilizing the sub-array configuration of the present invention.

In a preferred embodiment, use of a high resolution sub-array in combination with a wide field-of-view sub-array has particular advantages if the two sub-arrays are approximately "square". The term square is intended to mean that the number of elements in each sub-array would be approximately equal. In the extreme case, the most "square" array for the 256 element dimension in the above example would be a 16-element by 16-element sub-array arrangement. Similarly, the most "non-square" array would be a 256-element by 1-element sub-array arrangement.

In a preferred embodiment discussed above, an array of transducers is provided for generating complex-amplitude or phase-amplitude information, wherein certain array elements are selected to provide information having desired characteristics. The information from the selected elements is processed to provide more limited information but having certain desirable characterstics such as high resolution information from one sub-array and wide field-of-view information from another sub-array.

In an alternate embodiment of the present invention, tradeoffs between resolution and field-of-view may be obtained by controlling the transmitted frequency, where the field-of-view and resolution are related to frequency or wavelength, as shown in equations 1 and 2. For example, field-of-view may be increased with a decrease in transmitted frequency and resolution may be decreased with an increase in transmitted frequency. In a preferred embodiment, a single line array may be provided in place of the two line sub-arrays 311 and 312 shown in FIG. 3 for providing both high resolution, narrow field-of-view information and low resolution, wide field-of-view information such as by controlling transmitter frequency to obtain improved information characteristics.

Displays 500 and 600 are related to element spacing as a function of frequency, where the field-of-view and resolution are related to frequency (or wavelength) and array dimensions, as defined in equations 1 and 2 above. Two discrete displays 500 and 600 have been described for sub-arrays 311 and 312 to exemplify the present invention. Other convenient sub-arrays can be selected to optimize the particular system. In a preferred embodiment, sub-arrays may be selectable from an array 300 either by operator control or automatically to provide an optimum image. In one embodiment, an operator may vary control such as with field-of-view control 810 and resolution control 812. Reconstructor 126 interrogates controls 810 and 812 and selects the appropriate combination of array elements for sub-arrays 311 and 312 to provide the desired field-of-view and resolution characteristics with controls 810 and 812 respectively. In a system haaving an array 300, reconstructor 126 may receive information from each element in the array. Therefore, well known programming techniques may be used to select sub-arrays such as defined with sub-arrays 311, 312, and 314 and to process information from selected sub-arrays without processing the information from other elements in the array 300. Well known algorithms such as the Fast Fourier Transform algorithm can be applied relatively independent of array size and configuration and therefore can be used to process information for a full array 300 or for sub-arrays 311, 312, and 314.

Field-of-view control 810 and resolution control 812 may be well known controls such as thumbwheel switches which can be readily interrogated by computer reconstructor 126 such as with well known computer interface structures.

In another embodiment, a single display such as display 500 or display 600 may be provided or a plurality of displays may be provided wherein the field-of-view and resolution of each of the displays may be controlled with a thumbwheel switch such as controls 810 and 812 to permit an operator to vary the field-of-view and resolution of each display to adaptively obtain one or more display images that permits ambiguity resolution of a display image. For example, the field-of-view may be increased for display 600 to resolve the ambiguity of image 632 so that image portions 633 and 634 are again connected as shown in FIG. 7 for object 732. It should be recognized that an increase in the field-of-view from display 600 to display 700 may similarly include a reduction in resolution. In still another embodiment, an operator may use controls 810 and 812 to reduce the field-of-view of the display shown in FIG. 5 to encompass only sectors 522-525 to view objects 530 and 532 (without viewing the environment in sectors 520, 521, 526, and 527 which have no objects), thereby providing an increase in resolution. For this example, field-of-view has been reduced thereby increasing reconstruction speed or increasing resolution or a combination of improving reconstruction speed and resolution. It should be recognized that an increase in reconstruction speed will provide greater range resolution while an increase in reconstruction resolution will provide an improvement in image resolution for each range line.

In another embodiment, controls 810 and 812 may be used to control field-of-view, image resolution, and range resolution by varying the transmitted frequency. It can be seen from equations 1 and 2 that image resolution will improve as frequency increases and field-of-view will become narrower as frequency increases, where a single array such as sub-array 314 can provide a range of resolution and field-of-view characteristics in conjunction with a range of transmission frequencies.

In still another embodiment, a plurality of images each having different resolution and field-of-view characteristics may be provided by controlling alternate transmissions to have different frequencies, where a first transmission may have a high frequency for high resolution and narrow field-of-view, a second transmission may have nominal frequency for nominal resolution and nominal field-of-view, and a third transmission may have low frequency for low resolution and wide field-of-view. In this embodiment, the high frequency pulse may be transmitted first with the image reconstructed and displayed on a first display. After the first pulse had propagated to the maximum range andd the return signals have become low in amplitude, a second pulse would be transmitted, with the image reconstructed and displayed on a second display. Similarly, after the second pulse had propagated to the maximum range, a third pulse would be transmitted, with the image reconstructed and displayed on a third display. Operator control of transmission frequency for each pulse would provide control of field-of-view and resolution for a display, as described above for the examples discussed with reference to FIGS. 5 and 6.

Therefore, field-of-view and resolution may be controlled electronically or computationally to provide displays having a plurality of field-of-view and resolution characteristics, which may be displayed simultaneously on a plurality of displays, which may be varied by an operator, or both displayed simultaneously and varied by an operator to permit an operator to locate and to identify objects with different image resolution, range resolution and/or field-of-view.

Charge Coupled Device Signal Processor

Charged coupled devices (CCDs) may be used to provide signal processing in accordance with the present invention. CCDs are well known in the art, being monolithic integrated circuits having charge storage and charge transfer capability. The CCD may have one or more input terminals, one or more output terminals, and a plurality of charge transfer stages to "shift" the charge between stages. Arrangement of input stages, output stages, and transfer circuits are well known in the art. For simplicity of discussion, a CCD will be considered as a circuit having input signal lines, output signal lines, and various shiftable stages coupling input and output lines. The monolithic implementation of such a CCD is well known in the art and therefore will not be discussed herein.

CCD signal processors will be discussed with reference to FIG. 9 hereinafter in the embodiment of an acoustic imaging system. These CCD signal processor arrangements are intended to be generally applicable for many signal processing uses that will become obvious to those skilled in the art from the teachings of the present invention. For example, this CCD signal processor arrangement may be used as a demodulator, multiplexer, or sample-and-hold circuit for use in systems including data acquisition, analog signal processing, computer peripheral, telemetry, and other systems. Further, a hybrid memory embodiment may be used as an off-line computer memory, an on-line computer memory, a disk memory replacement, an analog memory for an analog or hybrid computer, and other arrangements.

CCD Demodulator and Multiplexer

In accordance with the present invention, a phase sensitive demodulator and a multiplexer arrangement will now be described with reference to FIG. 9A. To exemplify this embodiment of the present invention, it will be described relative to the channel processing arrangement for an acoustic imaging system 900.

An array of transducer elements 910 is provided to generate transducer signals 912 with each element 911 generating an output signal 913 in response to acoustic inputs sensed by elements 910. Signal processors 914 provide signal processing operations on signals 912, where these signal processing operations may include buffering, amplification, and noise filtering. Processed transducer signals 915 and 916 may each be input to one switch or a pair of switches shown as field effect transistor (FET) switches 917 and 918. One of each pair of switches may be controlled by an in-phase (0°) reference signal 930 and the other switch may be controlled by a quadrature (90°) reference signal 931. Reference generator 929 generates in-phase signal 930 and quadrature signal 931 for complex demodulation of processed signals 916 and 915 respectively. In one embodiment, reference generator 929 may have substantially the same frequency as the acoustic signals sensed by elements 910. As is well known in the art, sampling or switching an AC signal with a reference signal will provide an output signal that is related to the component of the input signal that is in-phase with the reference signal. Therefore, in-phase reference signal 930 controls in-phase FET 917 to provide in-phase demodulated signals and quadrature reference signal 931 controls quadrature FETs 918 to provide quadrature demodulated signals. CCD 920 is implemented to receive and store a plurality of demodulated input signals 919 with corresponding charge storage and shift elements, where each storage element in CCD 920 sums or integrates the charge provided by each corresponding signal 919 which are switched or demodulated with FETs 917 and 918. The amount of charge that is accumulated in each CCD storage element is related to the amplitude of the input signal and the time that switches 917 and 918 are conducting. The summation of samples controlled with FETs 917 and 918 cause a charge to be stored that has a magnitude related to the phase related components of the input signal 915 which is sampled in-phase with the corresponding reference signal 930 or 931.

Mode logic 921 controls system operations. A plurality of modes may be provided with control signals including demodulate and integrate mode signals 924, shift signal 922 and convert signal 923. These signals control the sequential modes of operation of the system. For example, demodulate and integrate signal 924 enables reference generator 929 to generate in-phase signal 930 and quadrature signal 931 to sample input signals 915 and 916 with switches 917 and 918 to build-up charge in corresponding elements of CCD 920, which demodulates and filters processed signals 915 and 916. After a predetermined period of time or quantity of integration samples, the shift and convert mode may be enabled, and the demodulate and integrate mode may be disabled; thereby causing signals 930 and 931 to turn off or "open" switches 917 and 918 to prevent further charge accumulation in CCD 920. Mode logic 921 may then generate clock pulses 922 to shift the stored charge through CCD 920 to output signal line 925. Analog-to-digital converter (ADC) 926 may be controlled with convert signal 923 to convert analog output signal 925 to digital form as digital signals 927. Clock signal 922 and convert signal 923 may be interleaved so that each analog signal 925 that is shifted out of CCD 920 will be converted with ADC 926 to provide sequential digital output signals 927. Therefore, it can be seen that the plurality of demodulated and integrated signals may be stored in CCD 920 and may be sequentially or serially shifted out of CCD 920 as analog output signals 925 and may be converted to sequential digital signals 927 with ADC 926. This arrangement provides a parallel-to-serial signal converter, which is known in the art as a multiplexer.

Mode logic 921 may be a well known counter and decoder arangement such as a Texas Instruments counter S/N 7490 and decoder 7442. Gating of clock signals and generation of quadrature signals is discussed in related patent applications which are incorporated herein by reference.

The arrangement described with reference to FIG. 9A further exemplifies a CCD arrangement for summing analog signals. Input signals 919 excite related CCD elements when switches 917 and 918 are conducting, where the CCD elements effectively add new charge that is related to the amplitude of input signal 919 to the charge previously stored in the corresponding CCD element.

Prior art phase sensitive demodulators provide a switching arrangement and a filtering arrangement, wherein the filtering arrangement "smooths" switching transitions to provide a steady state output signal. In system 900, switches 917 and 918 in conjunction with CCD 920 provide operations similar to that used in prior art phase sensitive demodulators. For example, switches 917 and 918 will switch processed signals 915 and 916 in-phase with reference signals 930 and 931 and charge storage elements of CCD 920 will integrate or filter the sampled processed signals 919 to provide a steady state charge signal proportional to the phase related component of processed signals 919 as a steady state charge amplitude without switching transients.

As is well known in the art, field effect transistor (FET) and charge coupled device (CCD) are compatible monolithic technologies and may be produced with the same monolithic process on the same monolithic ship. Therefore, the combination of FET inputs 917 and 918 and CCD register 920 has particular advantages. Further, as is well known in the art, FET's have extremely high input impedance. Therefore the combination of transducer array 910 and FET inputs 917 and 918 has particular advantages.

The CCD demodulator and multiplexer embodiment has been described for a combined phase sensitive demodulator and multiplexer arrangement. It is herein intended that the demodulator arrangement and the multiplexer arrangement may be usable as separate arrangements and may be combined in a preferred embodiment of the present invention. Further, any reference to a demodulator with reference to the embodiment shown in FIG. 9A is also intended to exemplify a sample-and-hold arrangement wherein the demodulator arrangement described with reference to FIG. 9A provides a sample and storage operation under control of mode signals and therefore further exemplifies a sample-and-hold arrangement. Still further, a plurality of samples may be added or integrated under control of the reference signals 930 and 931 using the storage and charge adding or charge integrating capabilities of the CCDs, exemplifying analog summation or integration and particularly analog summation or integration under control of digital logic signals.

Figure 9A:
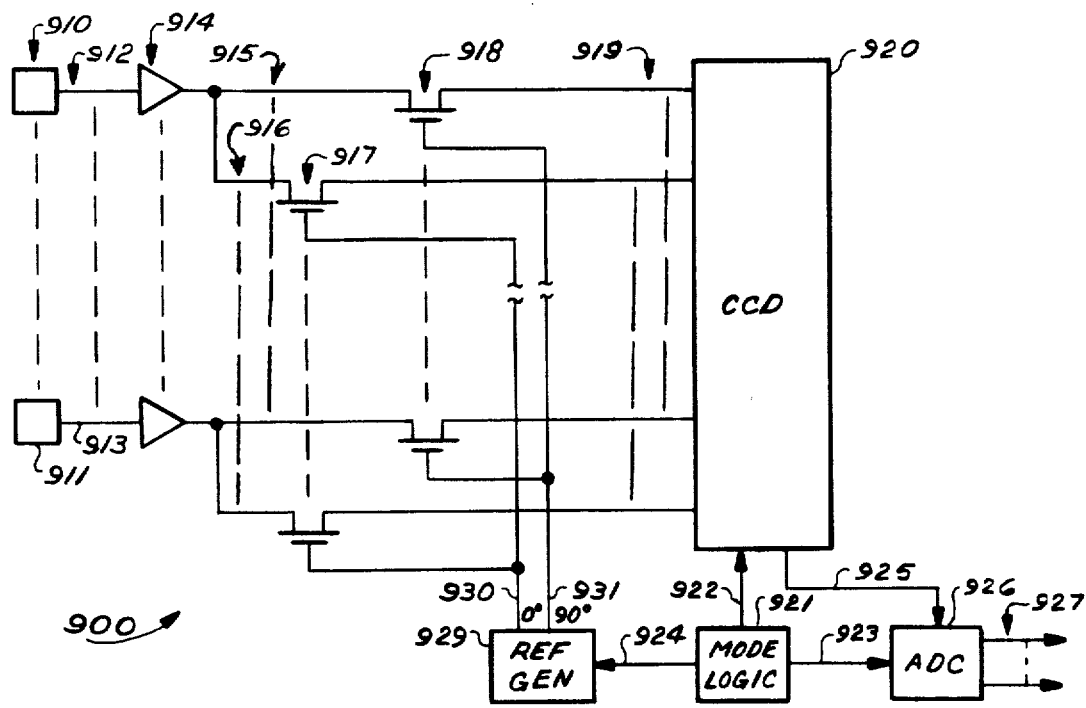
Figure 9B:
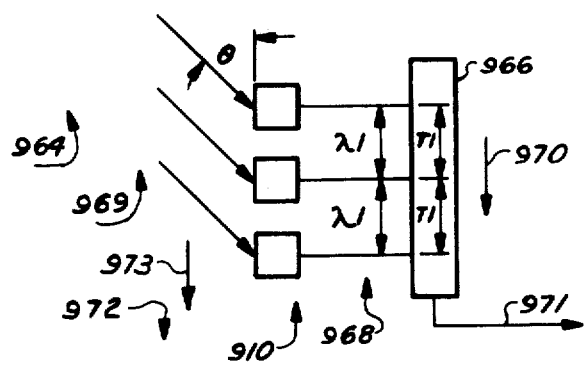

The elements shown in FIG. 9A may correspond to the elements shown in FIGS. 1, 2A, and 2B wherein transducer array 910 and transducer elements 911 shown in FIG. 9A may correspond to array 110 and elements 210 shown in FIGS. 1 and 2A, array output signals 912 and transducer signals 913 may correspond to signals 112 and 211 respectively as shown in FIGS. 1 and 2A, signal processor 914 and processed signals 915 and 916 may correspond to amplifier 212 and signal 214 as shown in FIG. 2A, switches 917 and 918 may correspond to PSDs 216 and 236 as shown in FIG. 2A, CCD 920 may correspond to filters 219 and 239 and multiplexer 118 as shown in FIGS. 1 and 2A, CCD output signal 925 may correspond to multiplexer output signal 121 as shown in FIG. 1, and ADC 926 and ADC output signals 927 may correspond to ADC 122 and signals 124 as shown in FIG. 1.

Beam Forming

A beam forming arrangement may be provided with a plurality of transducer elements for receiving incident illumination and a delay line having taps for introducing received energy from the transducers into the delay line. Assuming that the taps are equally spaced relative to the time delay therebetween, if the period of a signal introduced into the plurality of taps is equal to the time delay between taps, that signal will be reinforced at each tap and will exit the delay line having an amplitude related to the incident energy. If the period of the signal is different from the time delay between taps, the signal will not be reinforced to the same degree as in the above-mentioned case. Still further, if the waveform period is half the delay between taps, alternate taps would provide a signal 180 degrees out-of-phase with the preceding tap signal thereby cancelling the signal introduced at two adjacent taps. This is analogous to the operation of a well known phase sensitive demodulator wherein an input signal has a first frequency characteristic and wherein the reference signal has a frequency characteristic that is equal to the input signal frequency, different from the input signal frequency, or half of the input signal frequency respectively relative to the three delay line examples discussed above.

In one beam forming embodiment, a plurality of transducers 910 are shown receiving illumination along lines 969 from source 964. Transducer output signals 968 are connected to taps on CCD delay line 966. The input signals 968 propagate along CCD delay line 966 in the direction shown by arrow 970 to be generated as output signal 971, which is related to the time variying summation of input signals 968 having time delays T| on input lines 968. If the time delay between signal taps 968 is a fixed delay T| corresponding to a wavelength λ1 and if the spacing between transducers 910 is related to wavelength λ|, then the delay line 966 will enhance the signals by summing the input components in-phase and outputting the time varying summation on signal line 971. If the incident illumination 969 has a frequency f1 with a wavelength λ1, then energy coming from source 964 propagating in direction 973 parallel to the plane of transducers 910 will provide in-phase signal components at each of the transducers 910 for enhancement of signal 971. For frequencies lower than frequency f1, an angle θ may exist wherein the incident illumination projected upon transducer array 910 will have a wavelength component equal to λ1 and thereby satisfying the conditions for enhancement of output signal 971. Therefore, it can be seen that there is a relationship between the spacing λ1 of transducer elements 910, time delay T1 between delay line taps 968, frequency of incident illumination, and angle-of-incidence θ for signal enhancement.

In accordance with one feature of the present invention, a beam forming arrangement is provided having a controllable illuminating frequency which defines the angle θ viewed by the array 910. A variable transmitter frequency discussed with reference to FIG. 1 for reference frequency generator 113 and transmitter 104 and may be used with the beam forming arrangement of this inventive feature. It can be seen that the signal that will be enhanced with delay line 966 is a function of the frequency of the illumination and the angle θ of the incident illumination, wherein the component of wavelength in the plane of sensors 910 must be equal to distance λ1. Therefore, the lower the frequency the greater must be the angle θ and the higher the frequency the smaller must be the angle θ for enhancing signal 971. Further, signal 971 is related to the illuminated environment at an angle θ that is determined by the frequency of the incident illumination. Therefore, it can be seen that the direction of received beam θ is related to the frequency of the illumination, wherein the beam direction can be controlled by the illuminating frequency.

In accordance with the present invention, a variable frequency illuminator is provided to control the direction of the received beam 969 and therefore the portion of the environment to be interrogated, where the information is output as signal 971. Various well known arrangements may be used in conjunction with the system of the present invention including arrangements for controlling the transmitting frequency to sweep through a controllable angle θ to interrogate an environment.

In another embodiment of the present beam forming inventive feature, delay line 966 may be replaced with a CCD, as described above with reference to FIG. 9A. In this embodiment, CCD 920 receives input signals 919 from transducers 910. A clock generator 921 provides clock signals 922 to shift information along CCD 920 to the output signal 925. In this arrangement, it can be seen that the time delay between taps 919 is controlled by the frequency of clock 922, where the time delay is related to the clock frequency and to the number of shift stages between taps 919. For simplicity, it will herein be assumed that taps 919 are located one shift stage apart, wherein each clock pulse 922 will shift the charge that is accumulated at a particular tap 919 by one tap toward output signal 925.

CCDs have the characteristic of accumulating charge in relation to (1) the signal magnitude on an input line and (2) the time for which the signal is present. Therefore, the output signal on line 925 is related to the magnitude of signals 919 and the time of charge accumulation related thereto. Assuming that the time of charge accumulation is related to the shift frequency, the output signal 925 will be related to the signal magnitude on lines 919 for the time of charge accumulation. As discussed relative to FIG. 9B for the delay line 966, the output signal 925 will be related to the frequency of the illuminating energy, the time delay between shifting stored signals between input lines 919 and the angle of incidence θ of the illumination. Assuming that the frequency is constant and the time delay between input signal lines 919 is the frequency of shift clock signal 922, then beam angle θ that will cause signal 925 to be enhanced is inversely related to the frequency of clock signal 922, wherein a high clock frequency will steer the beam to a low angle and a low clock frequency will steer the beam to a high angle for enhancement of signals 925 and 971 related to the particular beam angle.

Therefore, beam forming may be achieved with a CCD arrangement and beam angle θ may be controlled by the frequency of clock signal 922.

The CCD arrangement set forth in FIG. 9A has been used to exemplify the CCD arrangement of the beam forming inventive feature. In this embodiment, switches 917 and 918 may be used for demodulating the input signals 916 or may be controlled to be conductive or "on" to provide greater similarity to the delay line embodiment discussed with reference to FIG. 9B. Further, the modes of integrate or shift as discussed for the demodulator and multiplexer arrangement with reference to FIG. 9A are interleaved as alternate integrate (sample) and shift commands for the beam forming feature of the present invention; wherein mode logic 921 may command integrate, shift, integrate, shift, etc. as alternate operations or interleaved operations for beam forming of input signals.

Background on beam forming concepts may be obtained from the prior art literature such as reference no. 13 by Dolph listed hereinafter and the references cited therein.

Hybrid Memory

Memories for storing digital information in digital form are well known in the art and include digital shift registers, disk memories, and magnetic tape. In one embodiment of the present invention, a "digital" memory is provided for storing information in analog signal form and for operating in conjunction with a digital system as a digital memory. The storage of information in analog signal form and the conversion between digital and analog signals for storage, for input, or for output will herein be termed a hybrid memory arrangement.

The hybrid memory feature of the present invention will now be described. This feature provides improved storage utilization. For example, analog signals may be stored and shifted within CCD memory 932 to an accuracy that, for this example, will be assumed to be better than one part in 256 or 8-bits of digital resolution. An analog signal having such resolution may require only a single shiftable memory cell. Digital signals stored and shiftable in CCD memory 932 having such digital resolution would require 8-bits of digital resolution to provide a resolution of one part in 256. Therefore, for this example an improvement in storage capacity by a factor of eight may be achieved, where 8-bit resolution analog information may be stored and shifted in CCD memory 932 requiring only one-eighth of the number of storage elements that would be required to store and shift 8-bit resolution digital information in CCD memory 932.

A hybrid memory arrangement using a CCD will now be described with reference to FIGS. 9C and 9D. Hybrid memory system 902 comprises CCD memory 932, input digital-to-analog converter (DAC) 933 and output analog-to-digital converter (ADC) 934. CCD memory 932 comprises a plurality of shiftable analog storage elements, wherein an analog input signal 949 is stored in a first CCD element and, under control of clock signal 943, input analog signal 949 is shifted through a plurality of CCD analog charge memory stages until it reaches an output stage which provides the shifted analog charge signal as output signal 936. Output analog signal 936 may be converted with ADC 934 to provide digital output signals 935 for use by a digital data processing system. Input digital signals 938B to DAC 933 are converted to analog signal 949 for storage in CCD memory 932. Information shifted out of CCD memory 932 may be recirculated as input information in analog signal form along recirculation path 939 or may be recirculated as digital signals from 938A to signals 938B. Information in CCD memory 932 may be changed by opening the recirculation path, either analog recirculation path 939 with switch 947 or digital recirculation path 938B with logic 940, and enabling digital input signals 938C with well known selection logic 940 or analog input signal 944 with switch 945.

Control logic 937 provides sequential control signals for clocking CCD memory 932 with clock signal 943 and for controlling the conversion of input and output information with convert signals 941 and 942. In one embodiment having digital recirculation, control logic 937 may provide clock signal 943 to provide a new output signal 936, then provide convert signals 941 and 942 to convert analog output signal 936 to digital signal 938A with ADC 934 and to convert digital signals 938B to analog signal 949. Signal 938A will be available to the digital system and will be further available for recirculation.

Operation and error reduction for a hybrid memory will now be discussed. An example will be provided to illustrate the relationships between signal degradation by a CCD memory and resolution of DAC 933 and ADC 934. In a preferred embodiment, ADC resolution is worse than DAC resolution which is worse than signal degradation through the CCD; where DAC and ADC resolution can be set to be worse than signal degradation. ADC 934 is assumed to have a conversion precision of 8-bits or one part in 256 for the present example, where this resolution is assumed to be greater than the degradation of the stored information in CCD memory 932. Further, DAC 933 is assumed to have a resolution greater than the resolution of ADC 934, which will be 9-bits or one part in 512 for the present example. Therefore, it can be seen that DAC 933 may have greater resolution than ADC 934, where the state of the least significant bit of DAC 933 may be considered to have no "significance" and therefore may be set to either the one or the zero state without affecting the operation of hybrid memory 902.

Therefore, in accordance with the present invention, the least significant bit of DAC 933, which is a "non-significant bit", will be set to the one state so that input analog signal 949 will always be on the high side of the permissible input signal variation, where any signal degradation through CCD memory 932 will merely be degradation of a part of the "non-significant" information or degradation of information that is always on the high side of the permissible variations within the resolution of ADC 934. Further, it can be seen that although analog signal 949 is degraded as it is shifted through CCD memory 932, the degradation will be less than the "non-significant" bit or "bias" imposed on signal 949 by DAC 933. This bias does not overlap to the next count of ADC 934 because it is also less than the resolution of ADC 934. Therefore, degradation of analog signal 949 through CCD memory 932 will always be less than the bias signal due to this "non-significant" bias bit in DAC 933 and therefore can never be degraded to the next lower count associated with ADC 934. Therefore, DAC 933 will re-establish the level of signal 949 independent of degradation through CCD memory 932, but neither re-establishment of the level with DAC 933 nor degradation of the signal shifted through CCD memory 932 will overlap the next highest count or degrade below the next lower count of ADC 934.

Figure 9C:
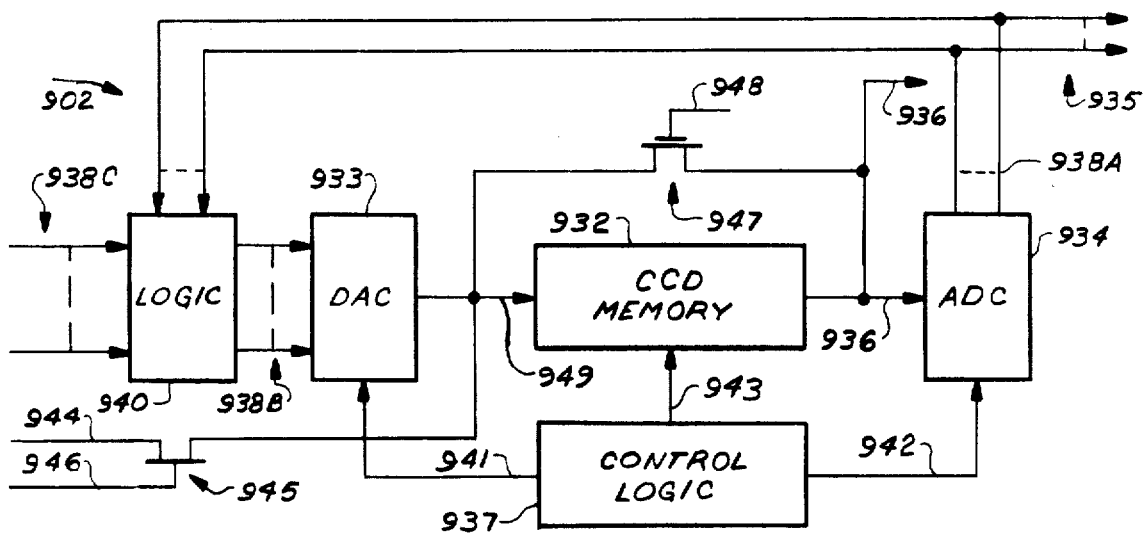
Figure 9D:
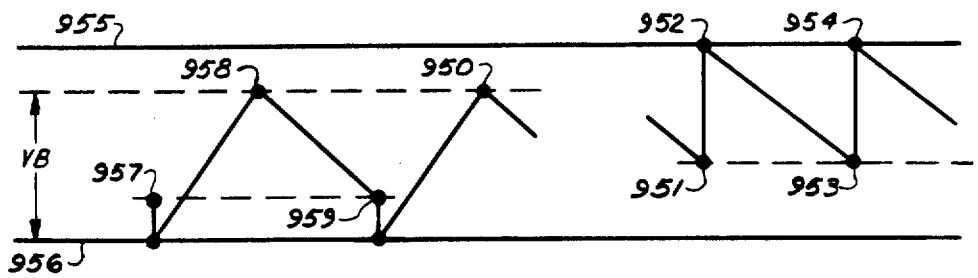

The error reduction concept can be better understood with reference to FIG. 9D, where a resolution increment of ADC 934 is shown bracketed by upper limit 955 and lower limit 956. Analog output signal 936 is shown having an amplitude 957 into ADC 934. ADC 934 converts signal 957 and rounds-off the output digital number to amplitude 956. The digital number related to amplitude 956 is recirculated as signals 938A and 938B to DAC 933 which converts amplitude 956 to an analog signal level and introduces an "non-significant" bit or bias having an amplitude VB which is less than the resolution increment between resolution amplitudes 956 and 955 but which is greater than the degradation of the signal 949 when shifted through CCD memory 932. Therefore, input signal 949 will have an amplitude that is equal to amplitude 956 plus the bias amplitude VB for a total amplitude shown as amplitude 958. As the analog input signal 949 is shifted through memory 932, it is degraded toward amplitude 959 and output as signal 936. Again, conversion of signal 936 having amplitude 959 with ADC 934 provides amplitude 956, which is again recirculated and converted to amplitude 950 and again shifted through CCD memory 932. Therefore, it can be seen how the roundoff with ADC 934 and the introduction of bias VB with DAC 933 automatically compensates for degradation of the signal shifted through memory 932, thereby compensating for an accumulation of error such as from round-off errors, bias related errors, and shift related errors.

In still another example, output analog signal 936 may be degraded to level 951, where ADC 934 converts the analog signal 951 to digital form and "rounds high" to the next higher increment of amplitude 952. Signal amplitude 952 is then degraded through recirculation, D/A conversion and shifting as described above to amplitude level 953 (the same as amplitude 951) as output signal 936 but is again converted with ADC 934 to digital form and again "rounded-high" to amplitude 954 (the same as amplitude 952) before again recirculating.

Rounding high may be accomplished with well known analog biasing, digital biasing, adding one digital increment, or other well known rounding techniques. For example, a "non-significant" or bias bit may be set to a fixed state to bias the digital number to the high side for a "round-high" arrangement.

In view of the above, it can be seen that degradation of an analog signal such as due to shifting, can be limited to a finite error or resolution region and can be prevented from accumulating without limit. Therefore, limiting the magnitude of error accumulation permits analog signal degradation to be tolerated and permits unlimited shifting operations with only a limited error accumulation.

The above described embodiments for elimination of accumulating error has been described relative to recirculation for a hybrid memory. It should be understood that this inventive feature has broad applicability, where this inventive feature may be practiced with any embodiment that either biases an input analog signal or rounds-off an output analog signal or both, biases an input signal and rounds-off an output signal as discussed relative to FIGS. 9C and 9D above.

In the above example, biasing and round-off of signals has been shown using digital techniques. Other bias and round-off techniques may be used. For example, analog biasing such as with summing resistors or by scaling the signals may be used. Similarly, round-off may be achieved with digitizing a signal. Other arrangements will now become obvious to those skilled in the art from the teachings of the present invention.

It can be seen that CCD memory 932 (FIGS. 9C and 9E) are electronic devices that may be shifted or not shifted under control of gated clock pulses 943 from control logic 937. Therefore, control of CCD memory may permit outputting of information on line 936 and inputting of information on line 949 while clocking CCD memory 932 or while holding the state of CCD memory 932 stationery by disabling clock 943. This is a significant advantage over the well known rotating memories such as disk memories, where a disk memory is continually rotating and may not be conveniently stopped due to the inertia of the memory and other such considerations. Therefore, a CCD memory that may be stopped under control of electronic signals will provide greater versatility in accessing and loading information and generally in operation of the memory device.

Figure 9E:
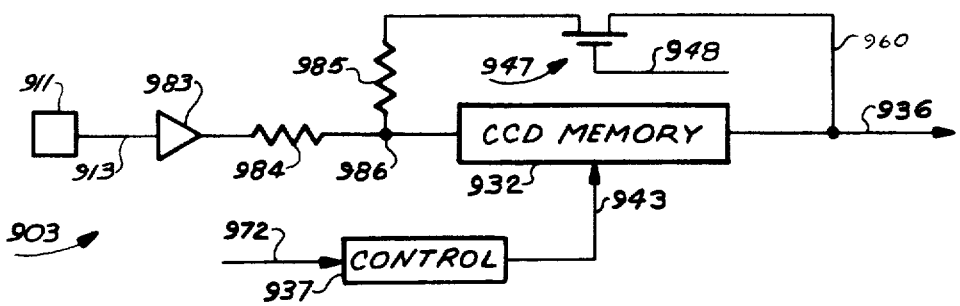

The CCD arrangements discussed with reference to FIGS. 9C-9E are described for embodiments wherein signals are stored in analog signal form having analog resolution. It will become obvious to those skilled in the art that these arrangements can also be used to store digital information such as in single bit form. For example, ADC 934 may be a single bit ADC such as a threshold detector. In one embodiment, a well known Schmidt trigger threshold detector may be used as a one-bit ADC 934 to detect whether the output information 936 is above or below a threshold, indicative of a binary one or a binary zero condition. If above the threshold, Schmidt trigger ADC 934 may restore the amplitude to an upper amplitude magnitude and, if below a threshold, Schmidt trigger ADC 934 may restore the signal to a lower amplitude magnitude. As described with reference to FIGS. 9C and 9D above, ADC 934 would restore the input signal 949 to an amplitude that may permit degradation through CCD memory 932 without traversing the higher level threshold, detected with ADC 934. This arrangement can be described with reference to FIG. 9D, where amplitude 956 may be defined as the high level threshold of Schmidt ADC 934, where an input signal 936 to ADC 934 above amplitude 956, such as amplitude 951, may be detected as a high level signal and may be restored to a high level recirculation amplitude 952. Shifting through CCD memory 932 would degrade amplitude 952 to amplitude level 953 which is still greater than the minimum high level amplitude 956; where ADC 934 may restore amplitude 953 to the high level recirculation amplitude 954. The system may have a characteristic where the difference between input threshold 956 and recirculation amplitude 955 is greater than the degradation of signal 949 when shifted through CCD memory 932, where this degradation may be the difference in amplitude between points 952 and 953 which is less than the difference in amplitude 955 (952) and 956. Input signals 936 to ADC 934 which are below threshold 956 may be recirculated as low level magnitudes.

Degradation of low level amplitudes may be of only secondary consideration because degradation of amplitudes through CCD memory 932 may tend to reduce the amplitude of the signal, thereby minimizing the detrimental effect on low level amplitudes. According to this consideration, it may be desirable to provide a high level amplitude for a first binary state and a low level amplitude for a second binary state, where the low level amplitude may be closer to zero voltage than to a high level negative amplitude. For example, representation of two binary states with a high level positive amplitude and a low level amplitude or a high level negative amplitude and a low level amplitude are preferred over an arrangement with representation of two binary states with a high level positive amplitude and a high level negative amplitude; where degradation of high level negative signals may be comparable to degradation of high level positive signals and where degradation of low level positive or negative signals may be minimized.

Now, an example will be provided to illustrate this degradation consideration. A binary signal will be assumed representing a one state whenever the signal amplitude is greater than a threshold amplitude 956 and a zero state whenever the signal amplitude is less than a threshold amplitude 956. Threshold signal amplitude 956 is assumed to be three volts, degraded signal amplitude 951 and 953 is assumed to be four volts, restored one level signal amplitude 952 and 954 are assumed to be five volts, and restored zero level signal amplitude (not shown) is assumed to be zero volts. As restored signal 952 is shifted through CCD memory 932, the signal is shown being degraded from a five volt amplitude 952 to a four volt amplitude 953, but four volts is greater than the three volt threshold of Schmidt trigger 934. Therefore, the four volt input signal 936 will be restored to an equivalent five volt output signal 938A at amplitude 954. As a zero level signal is shifted through CCD memory 932, the signal will be reduced in amplitude toward zero volts (if it is not already at zero volts) and will, therefore, not be degraded toward the threshold amplitude 956.

In another embodiment, the threshold signal is assumed to be zero volts, the restored binary one signal is assumed to be plus three volts, the restored binary zero signal is assumed to be minus three volts, and signal degradation is assumed to be from the plus voltage level and from the minus voltage level toward the zero voltage threshold level. Therefore, both the binary one and the binary zero voltage levels will degrade toward the threshold level. Therefore, this embodiment may be less desirable than the embodiment of the above example where only the binary one voltage level will degrade toward the threshold voltage level.

In still a further embodiment of the hybrid memory arrangement of the present invention, a ternary memory may be provided with a three state ADC 934, where the recirculation line 938A from ADC 934 may have three states including a positive amplitude, a zero amplitude, or a negative amplitude. ADC 934 may be implemented with a pair of Schmidt triggers, where a positive Schmidt trigger may generate a high level amplitude or low level amplitude in response to a high level or a low level positive amplitude of input signal 936 and a negative Schmidt trigger may generate a high level amplitude or a low level amplitude in response to a high level or low negative amplitude of input signal 936. Therefore, if input signal 936 has a high level positive amplitude, the positive Schmidt trigger would be in the positive high level state and the negative Schmidt trigger would be in the low level state; if input signal 936 had a low level amplitude, both positive and negative Schmidt triggers would be in the low level state; and if input signal 936 had a negative high level amplitude, the positive Schmidt trigger would be in the low level state and the negative Schmidt trigger would be in the negative high level state. Summing of Schmidt trigger outputs would provide a high level output if the positive Schmidt trigger was in the high level state, a negative output if the negative Schmidt trigger was in the negative high level state, and low level output if both Schmidt triggers were in the low level state. It should be noted that when one of the Schmidt triggers is in a high level state, the other Schmidt trigger is in the low level state consistent with ternary signal forms and with the binary nature of Schmidt trigger threshold detectors.

CCD Compositor

Compositors are well known in the geophysical art. One well known prior art compositor is implemented in the CAFDRS system sold by United Geophysical Corporation, an affiliate of Bendix Corporation located in Pasadena, Calif., which is implemented with a General Automation Corp. SPC-16 computer. Another well known compositor is the trace compositor, model 1011 manufactured by Scientific Data Systems of Santa Monica, Calif. and described in Technical Manual SDA 98 02 62A dated November 1967. Such compositors accept input waveforms from geophone transducers and store the sampled waveforms in memory, where corresponding samples of each sequential waveform are added together. The sampling and adding of input waveform samples to previously sampled and added corresponding waveform samples is known as compositing. Compositing effectively sums or integrates corresponding samples in the temporal or time domain to enhance the signal-to-noise ratio.

An improved compositor arrangement is shown in FIG. 9E using a CCD memory arrangement. CCD compositor 903 is shown for a single transducer input waveform. In a preferred embodiment, a plurality of compositor channels may be provided wherein one compositor channel per transducer may be used to composite each transducer input waveform known as a trace.

In reference to FIG. 9E, input transducer 911 generates transducer signal 913 which is preprocessed with buffer amplifier 983. Transducer signal from buffer amplifier 983 is input to CCD memory 932 through summing resistor 984. As data in CCD memory is shifted with clock pulses 943, the input signal 986 is shifted into and stored in CCD memory 932. Control signal 972 enables control 937 to generate clock pulses 943 for the period of a trace, where control signal 972 enables the shifting of CCD memory 932 at the start of an input trace from transducer 911 and control signal 972 disables the shifting of CCD memory 932 at the completion of the input trace from transducer 911. The first trace may be loaded into CCD memory 932, where the recirculation path 960 is disabled by making FET switch 947 non-conductive with control signal 948, which is indicative of the first trace to be loaded into CCD memory 932. Opening of the recirculation path 960 insures that the first trace will be loaded into CCD memory 932 and that prior contents of the CCD memory will not carry-over to the new composited information. For subsequent traces following the first trace, control signal 948 controls FET 947 to be conductive to provide a recirculation path for the composited information in CCD memory 932 to be recirculated and added to the input trace through summing resistor 985 to summing point 968, where the input trace signal will be added to summing point 986 through input summing resistor 984. Therefore, when a trace subsequent to the first trace is sensed by transducer 911, this new input trace will be summed with the recirculated composited information 960 and then shifted into CCD memory 932. Therefore, CCD memory 932 provides the operation of storing the composited information and summing resistors 984 and 985 provide the operation of adding the input information to the stored information.

The information stored in CCD memory 932 may be analog samples, wherein the shift clock 943 effectively samples a portion of input signal 913 by inputting to CCD memory on input signal line 986, then shifting under control of clock 943.

Input control signal 972 to control logic 937 may be related to the illuminating signal such as a well known chirp signal, where system 100 generates a control signal 145 to transmitter 104 (FIG. 1), which may be a well known VIBROSEIS device for illuminating an underground environment. Control signal line 972 may be derived from transmitter signal 145 to start the sampling and compositing of input signal 913 with CCD memory 932. Control 937 may include a timer such as a well known counter to provide clock pulses 943 for a fixed period of time starting with the transmitter command signal 145 input to control 937 as signal 972.

One distinction of the CCD compositor of the present invention is that the signals are added in the analog domain and are stored as analog signals in contrast to digital domain summing and storage in prior art systems. Another distinction is that a separate compositor channel may be used for each input channel rather than using the prior art time-shared adder and disk memory storage.

Additional distinctions and advantages may be obtained by using the hybrid memory teachings of the present invention discussed with reference to FIGS. 9C and 9D in conjunction with the compositor discussed with reference to FIG. 9E. In this arrangement, analog trace signals may be provided as analog input 944 to be added with recirculated signal 936 at summing point 949. Alternately, input information may be digitized with a well known ADC and may be input as signals 938C to logic 940 which may be well known adding logic to add the input information 938C to the recirculated information 938A to provide the summed digital information 938B for storage in CCD memory 932.

Another feature of the present invention provides for summing of analog signals which are input to a CCD. Such analog summing is exemplified with summing resistors 984 and 985 to summing junction 986 shown in FIG. 9E. Similarly, CCD input signals 919 (FIG. 9A) may be summed or otherwise combined but with other analog signals. Further, input signal 944 and recirculation 936 in hybrid memory arrangement 902 shown in FIG. 9C may be summed as input signal 949 if recirculation control signal 948 makes recirculation FET 947 conductive at the same time that input control signal 946 makes input FET 945 conductive. In a preferred embodiment, summing is performed with summing resistors as is well known in the art such as with summing resistors 984 and 985 to summing junction 986 as shown in FIG. 9E. For simplicity, summing resistors may not be shown such as for recirculation signal 936 and input signal 944 to summing junction 949. Still further, other analog summing arrangements are well known in the art.

In CCD compositor arrangement 903, an arrangement may be used to compensate for signal degradation, as discussed with reference to FIGS. 9C and 9D above. Further, recirculation 960 may be scaled to the proper amplitude such as with well known scaling techniques using ADC 934 or, alternately, by adjusting summing resistors 984 and 985.

References

Acoustic imaging systems are well known in the art, where the system of the present invention provides improvements to these well known imaging systems.

One prior art arrangement is the Acoustic Imaging System being built by Bendix Electrodynamics Division in Sylmar, Calif. for the Naval Undersea Research and Development Center in San Diego, Calif.

Another prior art acoustic imaging system is the Computer Augmented Field Data Recording System (CAFDRS) which has been developed and manufactured by United Geophysical of Pasadena, Calif. CAFDRS is used in geophysical research and exploration. These systems may be reconfigured from the teachings of the present invention to practice this invention.

Various publications may be used for providing background for this invention and for illustrating the prior art. The various subject areas and associated references for each subject area are listed below.
1. Bryant, Steven B.: "Acoustic Imaging By Computer Reconstruction" report no. NUC TN 309, Naval Undersea Research and Development Center (NUC), Pasadena, Calif., November 1969.
2. Keil, Tenny J.: "The Methods of Acoustic Imaging" report no. NUWC TN 161, Naval Undersea Research and Development Center (NUC), Pasadena, Calif., August 1968.
3. Lopes, L. A. and O. F. Thomas: "A Digital Camera for Acoustic Applications" report no. NUWC TN 219, Naval Undersea Research and Development Center (NUC), Pasadena, Calif., December 1968.
4. Metherell, Alexander F., et. al.: "Introduction to Acoustical Holography", *The Journal of the Acoustical Society of America*, 42:4, 1967.
5. Deschamps, Georges A.: "Some Remarks on Radio-Frequency Holography," Proceedings of the IEEE, April 1967.
6. Huang, T. S. and H. L. Kasnitz: Proceedings of the Computerized Imaging Techniques Seminar, Society for Photo-Optical Instrumention Engineers, XVII-1, 1967.
7. Goodman, Joseph W.: *Introduction to Fourier Optics*, McGraw-Hill Book Company, San Francisco, Calif., 1968.
8. DeVelis, John B. and George O. Reynolds: *Theory and Applications of Holography*, Addison-Wesley Publishing Company, Reading, Mass.
9. Robiner, Lawrence R. and Radner, Charles M. (Editors): "Digital Signal Processing" IEEE Press, 1972.
10. Butler, D. and Harvey, G.: "The Fast Fourier Transform and its Implementation".
11. Electronic Design Magazine May 10, 1973.
12. Klauder et. al; "The Theory and Design of Chirp Radars"; *The Bell System Technical Journal;* vol. XXXIX; no. 4; July 1960.
13. Dolph, C. L.; "A Current Distribution For Broadside Arrays Which Optimizes The Relationship Between Beam Width and Side-Lobe Level"; *Proceedings of the IRE and Waves and Electrons;* June 1946.
14. Anstey, N. A.; "Correlation Techniques—A Review".

These publications and the publications referenced therein provide non-essential subject matter and are incorporated herein by reference.

General Considerations

The present invention has been described for an underwater acoustic imaging system in order to exemplify the teachings of the present invention. It is intended that the acoustic imaging system be merely exemplary of the broad scope and features of the present invention.

It is herein intended that the system of the present invention discussed for an acoustic imaging embodiment be exemplary of other such imaging systems including radar systems, laser systems, and the like. Further, this invention is directed to the broad field of processing coherent signals and processing signals having phase and amplitude relationships such as exemplified by acoustic hydrophone signals related to an acoustic interference pattern.

Terminology pertaining to illumination is herein intended to include acoustic illumination; electromagnetic illumination including radio waves, laser waves and visible illumination; and other forms of illumination. Illumination provides for illuminating or ensonifying an environment, a medium or an object and provides for generating illumination signal inputs such as reflected illumination having characteristics of the environment. For example, illumination of an undersea environment with an acoustic transmitter provides reflected input acoustic signals to a hydrophone array, wherein the input acoustic signals have an interference pattern related to the characteristics of the undersea environment such as the characteristics of the medium and the characteristics of objects located therein.

The term "medium" is herein intended to mean the transmission medium for transmission of and for propagation of the illumination signals. For example, the acoustic medium may be seawater, the radar medium may be the atmosphere or space, and the geophysical medium may be the earth.

Illumination may be generated with a transmitter such as an acoustic transmitter as discussed above or as a well known radar transmitter or laser transmitter which provide a source of illumination energy for illuminating an environment. The terms "input transducers" and other terms pertaining thereto are herein intended to mean general transducers and transducer arrays exemplified by a hydrophone array for an acoustic imaging system, a photoelectric array for a laser system, a photosensitive medium for light, a well known radio receiver array for a radar system and other known input transducer arrangements.

Terminology relating to an output device is intended to be broadly interpreted and to include operator displays such as the well known CRT display for displaying information, projection displays such as forming an image on a screen or without a screen as is well known for laser holography, photographic film for recording an image, digital recording devices such as magnetic tape devices for recording digital image information, or other output devices for receiving image information. Further, output signals may be interference pattern outputs such as analog signals 121 and digital signals 124 to provide interference pattern information to the output devices discussed above.

Terms pertaining to holography are herein intended to include signals related to coherent illumination, interference patterns, phase signals, amplitude signals, phase and amplitude signals and the like.

Components have been shown in the figures in simplified schematic form to more easily exemplify the present invention, wherein circuit design is a well known art and wherein use of such components are well known in the art. Further, many alternate circuit embodiments and component types may be used to implement the discussed embodiments. For example, switches 216 (FIG. 2A) and FETs 917 and 918 (FIG. 9A) can be implemented with well known switches including electronic switches such as FETs and bipolar transistors and even mechanical switches such as relays. Further, improved capabilities may be obtained by higher levels of integration. For example, FETs 917 and 918 may be manufactured as part of CCD 920 (FIG. 9A) to provide the combined capabilities of demodulation, filtering, and multiplexing with monolithic circuits.

The system of the present invention is intended to have a broad scope wherein the acoustic signal processing system is intended to exemplify a generalized signal processing arrangement; CCDs are intended to exemplify generalized arrangements for storing analog signals, processing analog signals and/or transferring analog signals; FET and correlator processors are intended to exemplify generalized digital filtering or processing arrangements; and other such devices are intended to exemplify generalized arrangements.

The term interference pattern and terms related thereto are intended to mean spatial variations in phase and/or amplitude of a signal which may represent a characteristic of the transmission medium such as due to an object in the medium.

An array and a sub-array are herein intended to mean a plurality of transducers that are spatially distributed such as for receiving signals that have spatial variations.

The term signal is herein intended to include electrical signals, acoustic signals, illumination signals, and other known signals which may be sensed such as with a transducer and which may be processed such as with a filter.

Resolution is the fineness of the data. When resolution is relatively better it is characterized as being higher, finer or greater and when resolution is relatively worse it is characterized as being lower, coarser, or poorer.

Gating of clock signals and generation of control signals is well known in the art, where preferred embodiments are set forth in copending patent applications. For example, the digital tachometer arrangement shown in FIG. 6 of said copending application Control Apparatus Ser. No. 135,040 shows a clock gating arrangement wherein gate 94 generates clock pulses at output 89 starting when input signal 18 makes a positive transition and continuing until counter 98 generates an output signal 100 to disable generation of clock pulses at gate output 89. This arrangement may be used to control the compositor shifting starting at the beginning of a trace, defined with input signal 18, and ending at the completion of a trace time period, defined with counter 98, when counter output signal 99 goes high; thereby disabling clock pulses 89 with signal 100 to gate 94. Further, copending application Control System And Method Ser. No. 134,958 sets forth a control signal and clock gating arrangement that is described therein with reference to FIG. 3B. The patents copending herewith are incorporated herein by reference as if fully set forth at length herein.

From the above description it will be apparent that there is thus provided a device of the character described possessing the particular features of advantage before enumerated as desireable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A signal processing system comprising:
   a transducer array for generating a plurality of analog input signals;
   signal processing means for generating processed analog signals in response to the analog input signals; and
   shift means for generating a shifted sequence of analog signals in response to the processed analog signals, wherein said shift means includes a CCD shift register for generating a beam formed signal.

* * * * *